(12) United States Patent
Yoshida et al.

(10) Patent No.: US 9,390,829 B2
(45) Date of Patent: *Jul. 12, 2016

(54) PASTE COMPOSITION FOR ELECTRODE AND PHOTOVOLTAIC CELL

(75) Inventors: Masato Yoshida, Tsukuba (JP); Takeshi Nojiri, Tsukuba (JP); Mitsunori Iwamuro, Tsukuba (JP); Shuuichirou Adachi, Tsukuba (JP); Keiko Kizawa, Tsukuba (JP); Takuya Aoyagi, Hitachi (JP); Hiroki Yamamoto, Hitachi (JP); Takashi Naito, Hitachi (JP); Takahiko Kato, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 142 days.

This patent is subject to a terminal disclaimer.

(21) Appl. No.: 13/012,901

(22) Filed: Jan. 25, 2011

(65) Prior Publication Data

US 2011/0277831 A1    Nov. 17, 2011

Related U.S. Application Data

(60) Provisional application No. 61/298,058, filed on Jan. 25, 2010, provisional application No. 61/388,070, filed on Sep. 30, 2010.

(51) Int. Cl.
    *H01L 31/00*        (2006.01)
    *H01B 1/22*        (2006.01)
    *H01L 31/0224*        (2006.01)

(52) U.S. Cl.
    CPC ............ *H01B 1/22* (2013.01); *H01L 31/022425* (2013.01); *Y02E 10/50* (2013.01)

(58) Field of Classification Search
    CPC .................. H01L 31/022425; H01L 31/0224; H01B 1/22
    USPC ..................................... 252/512, 514; 136/255
    See application file for complete search history.

(56) References Cited

U.S. PATENT DOCUMENTS 4,843,693 A * 7/1989 Chisholm ............ B23K 1/0012
                                               228/173.6
5,855,820 A    1/1999 Chan
6,132,528 A * 10/2000 Brauer ...................... C22C 9/04
                                                 148/434

(Continued)

FOREIGN PATENT DOCUMENTS

CN        101035641      9/2007
EP        1850352 A1      10/2007

(Continued)

OTHER PUBLICATIONS

Xu et al., Material Letters, 57 (2003) 3987-3991.*

(Continued)

*Primary Examiner* — Eli Mekhlin
(74) *Attorney, Agent, or Firm* — Fitch, Even, Tabin & Flannery, LLP

(57) ABSTRACT

The paste composition for an electrode are constituted with copper-containing particles having a peak temperature of an exothermic peak showing a maximum area in the simultaneous ThermoGravimetry/Differential Thermal Analysis of 280° C. or higher, glass particles, a solvent, and a resin. Further, the photovoltaic cell has an electrode formed by using the paste composition for a photovoltaic cell electrode.

17 Claims, 5 Drawing Sheets

(56) References Cited

U.S. PATENT DOCUMENTS

| | | | |
|---|---|---|---|
| 6,228,288 B1 | 5/2001 | Chacko | |
| 2001/0051387 A1 | 12/2001 | Nakagawa | |
| 2005/0277550 A1 | 12/2005 | Brown et al. | |
| 2007/0221270 A1 | 9/2007 | Watsuji | |
| 2008/0178930 A1* | 7/2008 | Konno | 136/252 |
| 2009/0101210 A1* | 4/2009 | Carroll et al. | 136/261 |
| 2009/0140217 A1 | 6/2009 | Wang et al. | |
| 2009/0255584 A1* | 10/2009 | Carroll | 136/261 |
| 2009/0266409 A1 | 10/2009 | Wang | |
| 2009/0288697 A1 | 11/2009 | Shimizu | |
| 2010/0096002 A1 | 4/2010 | Hayashi et al. | |
| 2010/0096014 A1* | 4/2010 | Iida et al. | 136/265 |
| 2010/0243048 A1 | 9/2010 | Laudisio | |
| 2011/0083874 A1 | 4/2011 | Kuroki | |
| 2013/0048047 A1 | 2/2013 | Fujii | |

FOREIGN PATENT DOCUMENTS

| | | | |
|---|---|---|---|
| JP | 62-022868 A | | 1/1987 |
| JP | 62296559 A | * | 12/1987 |
| JP | 64-057762 A | | 3/1989 |
| JP | 03-78906 A | | 4/1991 |
| JP | 5-29639 A | | 2/1993 |
| JP | 5-159621 A | | 6/1993 |
| JP | 6-290635 A | | 10/1994 |
| JP | 09-241862 A | | 9/1997 |
| JP | 11-162859 A | | 6/1999 |
| JP | 2000-082332 A | | 3/2000 |
| JP | 2001110232 A | * | 4/2001 |
| JP | 2001-223738 A | | 8/2001 |
| JP | 2003-123533 A | | 4/2003 |
| JP | 2004-79211 A | | 3/2004 |
| JP | 2004-217952 A | | 8/2004 |
| JP | 2005-222737 A | | 8/2005 |
| JP | 2005-242724 A | | 9/2005 |
| JP | 2005-277058 A | | 10/2005 |
| JP | 2005-314755 A | | 11/2005 |
| JP | 2006-004905 A | | 1/2006 |
| JP | 2006-096988 A | | 4/2006 |
| JP | 2006-204512 A | | 8/2006 |
| JP | 2006-313744 A | | 11/2006 |
| JP | 2007-123301 A | | 5/2007 |
| JP | 2007-184143 A | | 7/2007 |
| JP | 2008-108629 A | | 5/2008 |
| JP | 2008-138969 A | | 6/2008 |
| JP | 2008-226816 A | | 9/2008 |
| JP | 2008-251324 A | | 10/2008 |
| JP | 2008-285589 A | | 11/2008 |
| JP | 2009-099443 A | | 5/2009 |
| JP | 2010059469 A | * | 3/2010 |
| JP | 2010-144138 A | | 7/2010 |
| JP | 2010-161331 A | | 7/2010 |
| JP | 2010-186862 A | | 8/2010 |
| JP | 2010-287821 A | | 12/2010 |
| WO | WO 2008/078374 A1 | | 7/2008 |
| WO | WO 2008078374 A1 | * | 7/2008 |
| WO | 2008139995 A1 | | 11/2008 |
| WO | 2009041506 A1 | | 4/2009 |
| WO | 2009041526 A1 | | 4/2009 |
| WO | WO-2010/109541 A1 | | 9/2010 |
| WO | WO-2012/033059 A1 | | 3/2012 |

OTHER PUBLICATIONS

"Sunlight Power Generation, Newest Technology and Systems", edited by Yoshihiro Hamakawa, CMC Books, 2001, p. 26-27.
Office Action issued Apr. 5, 2013, in U.S. Appl. No. 13/012,920.
Office Action issued Sep. 13, 2012, in U.S. Appl. No. 13/013,293.
Office Action issued Mar. 7, 2013, in U.S. Appl. No. 13/013,293.
Office Action issued Aug. 22, 2013, in U.S. Appl. No. 13/013,293.
Office Action issued Sep. 20, 2013, in U.S. Appl. No. 13/444,838.
Office Action issued Sep. 20, 2013, in U.S. Appl. No. 13/444,834.
U.S. Appl. No. 13/012,920, filed Jan. 25, 2011.
U.S. Appl. No. 13/012,947, filed Jan. 25, 2011.
U.S. Appl. No. 13/013,230, filed Jan. 25, 2011.
U.S. Appl. No. 13/013,293, filed Jan. 25, 2011.
U.S. Appl. No. 13/439,955, filed Apr. 5, 2012.
U.S. Appl. No. 13/444,838, filed Apr. 11, 2012.
U.S. Appl. No. 13/444,834, filed Apr. 22, 2012.
Extended European Search Report dated Oct. 7, 2013, in European Patent Application No. EP 11734821.9.
Office Action issued Jun. 24, 2014 in Japanese Patent Application No. 2010-222203.
CN office action of Appln. No. 201180006684.0 dated Mar. 6, 2015 with partial English translation.
JP Office Action of Appln. No. 2014-171014 dated May 19, 2015 with English translation.

* cited by examiner

PASTE COMPOSITION FOR ELECTRODE AND PHOTOVOLTAIC CELL

CROSS-REFERENCE TO RELATED APPLICATIONS

This application claims priority under 35 U.S.C. 119(e) to Provisional U.S. Patent Application No. 61/298,058, filed Jan. 25, 2010, and Provisional U.S. Patent Application No. 61/388,070, filed Sep. 30, 2010, the disclosures of which are incorporated by reference herein.

BACKGROUND OF THE INVENTION

1. Field of the Invention

The present invention relates to a paste composition for an electrode and a photovoltaic cell.

2. Description of the Related Art

Generally, a crystalline silicon-based photovoltaic cell is provided with a surface electrode, in which the wiring resistance or contact resistance of the surface electrode is associated with a voltage loss related to conversion efficiency, and further, the wiring width or shape has an influence on the amount of the incident sunlight (see, for example, "Sunlight Power Generation, Newest Technology and Systems", edited by Yoshihiro Hamakawa, CMC Books, 2001, p. 26-27).

The surface electrode according to the photovoltaic cell is usually formed in the following manner. That is, a conductive composition is applied onto an n-type semiconductor layer formed by thermally diffusing phosphorous and the like on the light-receiving surface side of a p-type silicon substrate at a high temperature by screen printing or the like, and sintered at a high temperature of 800 to 900° C., thereby forming a surface electrode. This conductive composition for forming the surface electrode includes conductive metal powders, glass particles, various additives, and the like.

As the conductive metal powders, silver powders are generally used, but the use of metal powders other than silver powders is being investigated for various reasons. For example, a conductive composition capable of forming an electrode for a photovoltaic cell, including silver and aluminum, is disclosed (see, for example, Japanese Patent Application Laid-Open (JP-A) No. 2006-313744). In addition, a composition for forming an electrode, including metal nanoparticles including silver and metal particles other than silver, is disclosed (see, for example, JP-A No. 2008-226816).

SUMMARY OF THE INVENTION

Silver that is generally used to form an electrode is a noble metal, and in view of problems regarding resources and also from the viewpoint that the ore is expensive, it is desirable to propose a paste material which replaces the silver-containing conductive composition (silver-containing paste). Examples of promising materials for replacing silver include copper which is employed in semiconductor wiring materials. Copper is abundant as a resource and the cost of the ore is inexpensive, at as low as about one hundredth that of silver. However, copper is a material susceptible to oxidation at high temperatures of 200° C. or higher, and for example, in the composition for forming an electrode described in JP-A No. 2008-226816, when the composition includes copper as a conductive metal, a specific step in which the composition is sintered under an atmosphere of nitrogen or the like in order to form an electrode, is required.

It is an object of the present invention to provide a paste composition for an electrode, which is capable of forming an electrode having a low resistivity with inhibition of the oxidation of copper at a time of sintering, and a photovoltaic cell having an electrode formed by using the paste composition for an electrode.

A first embodiment of the present invention is a paste composition for an electrode, including copper-containing particles having a peak temperature of an exothermic peak showing a maximum area in the simultaneous Thermo-Gravimetry/Differential Thermal Analysis (TG-DTA) of 280° C. or higher, glass particles, a solvent, and a resin.

The copper-containing particles are preferably at least one selected from phosphorous-containing copper alloy particles, silver-coated copper particles, and copper particles surface-treated with at least one selected from the group consisting of triazole compounds, saturated fatty acids, unsaturated fatty acids, inorganic metal compound salts, organic metal compound salts, polyaniline-based resins, and metal alkoxides.

The glass particles preferably have a glass softening point of 600° C. or lower and a crystallization starting temperature of higher than 600° C., and more preferably contain diphosphorus pentoxide-divanadium pentoxide ($P_2O_5$—$V_2O_5$)-based glass.

The paste composition for an electrode preferably further includes silver particles, and more preferably, the content of the copper-containing particles is from 9% by mass to 88% by mass when the total amount of the copper-containing particles and the silver particles are taken as 100% by mass. Further, even more preferably, the total content of the copper-containing particles and the silver particles is from 70% by mass to 94% by mass, the content of the glass particles is from 0.1% by mass to 10% by mass, and the total content of the solvent and the resin is from 3% by mass to 29.9% by mass.

The paste composition for an electrode preferably further includes a phosphorous-containing compound, and more preferably, the phosphorous-containing compound is at least one selected from the group consisting of phosphoric acid, ammonium phosphate, phosphoric ester, and cyclic phosphazene.

A second embodiment of the present invention is a paste composition for an electrode, including phosphorous-containing copper alloy particles, glass particles, a solvent, and a resin.

The glass particles more preferably have a glass softening point of 600° C. or lower and a crystallization starting temperature of higher than 600° C., and even more preferably contain diphosphorus pentoxide-divanadium pentoxide ($P_2O_5$—$V_2O_5$)-based glass.

The paste composition for an electrode preferably further includes silver particles, and more preferably, the content of the copper-containing particles when the total amount of the copper-containing particles and the silver particles are taken as 100% by mass is from 9% by mass to 88% by mass. Further, even more preferably, the total content of the copper-containing particles and the silver particles is from 70% by mass to 94% by mass, the content of the glass particles is from 0.1% by mass to 10% by mass, and the total content of the solvent and the resin is from 3% by mass to 29.9% by mass.

The paste composition for an electrode preferably further includes a phosphorous-containing compound, and more preferably, the phosphorous-containing compound is at least one selected from the group consisting of phosphoric acid, ammonium phosphate, phosphoric ester, and cyclic phosphazene.

A third embodiment of the present invention is a paste composition for an electrode, including silver-coated copper particles, glass particles, a solvent, and a resin.

The glass particles preferably have a glass softening point of 600° C. or lower and a crystallization starting temperature of higher than 600° C., and more preferably contain diphosphorus pentoxide-divanadium pentoxide-based glass.

The paste composition for an electrode preferably further includes silver particles, and more preferably, the content of the copper-containing particles when the total amount of the copper-containing particles and the silver particles are taken as 100% by mass is from 9% by mass to 88% by mass. Further, even more preferably, the total content of the copper-containing particles and the silver particles is from 70% by mass to 94% by mass, the content of the glass particles is from 0.1% by mass to 10% by mass, and the total content of the solvent and the resin is from 3% by mass to 29.9% by mass.

The paste composition for an electrode preferably further includes phosphorous-containing compound, and more preferably, the phosphorous-containing compound is at least one selected from the group consisting of phosphoric acid, ammonium phosphate, phosphoric ester, and cyclic phosphazene.

A fourth embodiment of the present invention is a paste composition for an electrode, including copper particles surface-treated with at least one selected from the group consisting of triazole compounds, saturated fatty acids, unsaturated fatty acids, inorganic metal compound salts, organic metal compound salts, polyaniline-based resins, and metal alkoxides, glass particles, a solvent, and a resin.

The glass particles preferably have a glass softening point of 600° C. or lower and a crystallization starting temperature of higher than 600° C., and more preferably contain diphosphorus pentoxide-divanadium pentoxide-based glass.

The paste composition for an electrode preferably further includes silver particles, and more preferably, the content of the copper-containing particles when the total amount of the copper-containing particles and the silver particles are taken as 100% by mass is from 9% by mass to 88% by mass. Even more preferably, the total content of the copper-containing particles and the silver particles is from 70% by mass to 94% by mass, the content of the glass particles is from 0.1% by mass to 10% by mass, and the total content of the solvent and the resin is from 3% by mass to 29.9% by mass.

The paste composition for an electrode preferably further includes a phosphorous-containing compound, and more preferably, the phosphorous-containing compound is at least one selected from the group consisting of phosphoric acid, ammonium phosphate, phosphoric ester, and cyclic phosphazene.

A fifth embodiment of the present invention is a photovoltaic cell having an electrode formed by sintering the paste composition for an electrode provided to a silicon substrate.

According to the present invention, a paste composition for an electrode, which is capable of forming an electrode having a low resistivity by inhibiting the oxidation of copper at a time of sintering, and a photovoltaic cell having an electrode formed by using the paste composition for the electrode are provided.

DETAILED DESCRIPTION OF THE INVENTION

Figure 1:
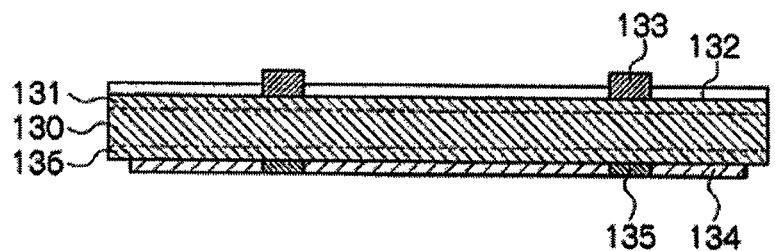
FIG. 1 is a cross-sectional view of the photovoltaic cell according to the present invention.

Hereinafter, the embodiments of the present invention will be described in detail. Furthermore, in the present specification, "to" denotes a range including each of the lower limit and the upper limit of the values described before and after the reference.

<Paste Composition for Electrode>

The paste composition for an electrode according to the present invention includes at least one kind of copper-containing particles having a peak temperature of an exothermic peak showing a maximum area in the simultaneous ThermoGravimetry/Differential Thermal Analysis (TG-DTA) of 280° C. or higher, at least one kind of glass particles, at least one kind of solvent, and at least one kind of resin.

By adopting such a constitution, it becomes possible to form an electrode having a low resistivity while inhibiting the oxidation of copper at a time of sintering.

(Copper-Containing Particles)

The copper-containing particles in the present invention have a peak temperature of an exothermic peak showing a maximum area in the simultaneous ThermoGravimetry/Differential Thermal Analysis (TG-DTA) of 280° C. or higher. By using the copper-containing particles imparted with oxidation resistance, the oxidation of the metal copper can be inhibited at a time of sintering, thereby forming an electrode having a low resistivity. Further, the simultaneous ThermoGravimetry/Differential Thermal Analysis is typically carried out in a normal atmosphere using a ThermoGravimetry/Differential Thermal Analysis analyzer (TG/DTA-6200 type, manufactured by SII Nano Technology Inc.), for example, under the conditions of a measurement temperature range: room temperature to 1000° C., a temperature increase rate: 40° C./min., and an atmospheric air flow rate: 200 ml/min.

Generally, when pure copper (metal copper) is subjected to simultaneous ThermoGravimetry/Differential Thermal Analysis, the peak temperature in the exothermic peak showing a maximum area is around 200° C., but for the copper-containing particles used in the present invention, the peak temperature is 280° C. or higher. Further, in the present invention, from the viewpoint of the low resistivity as an electrode, the peak temperature is preferably from 280 to 800° C., more preferably from 290 to 750° C., and even more preferably from 350 to 750° C.

The copper-containing particles having a peak temperature in the exothermic peak showing a maximum area of 280° C. or higher can be constituted by imparting the copper particles with oxidation resistance.

Specific examples thereof include phosphorous-containing copper alloy particles, silver-coated copper particles, and copper particles surface-treated with at least one selected from the group consisting of triazole compounds, saturated fatty acids, unsaturated fatty acids, inorganic metal compound salts, organic metal compound salts, polyaniline-based resins, and metal alkoxides, and at least one selected there-from is preferably used. Further, the copper-containing particles may be used singly or in combination of two or more kinds thereof.

The particle diameter of the copper-containing particle is not particularly limited, and it is preferably from 0.4 to 10 μm, and more preferably from 1 to 7 μm in terms of a particle diameter when the cumulative weight is 50% (hereinafter abbreviated as "D50%" in some cases). By setting the particle diameter to 0.4 μm or more, the oxidation resistance is improved more effectively. Further, by setting the particle diameter to 10 μm or less, the contact area at which the copper-containing particles contact each other in the electrode increases, whereby the resistivity is reduced more effectively. In addition, the particle diameter of the copper-containing particle is measured by means of a MICROTRAC particle size distribution analyzer (MT3300 type, manufactured by Nikkiso Co., Ltd.).

In addition, the shape of the copper-containing particle is not particularly limited, and it may be any one of an approximately spherical shape, a flat shape, a block shape, a plate shape, a scale-like shape, and the like. From the viewpoint of the oxidation resistance and the low resistivity, the shape of the copper-containing particle is preferably an approximately spherical shape, a flat shape, or a plate shape.

The content of the copper-containing particles, and when including the silver particles as described later, the total content of the copper-containing particles and the silver particles, which are respectively included in the paste composition for an electrode according to the present invention, can be, for example, from 70% by mass to 94% by mass, and from the viewpoint of the oxidation resistance and the low resistivity, it is preferably from 72% by mass to 90% by mass, and more preferably from 74% by mass to 88% by mass.

Further, in the present invention, conductive particles other than the copper-containing particles may be used in combination therewith.

—Phosphorous-Containing Copper Alloy Particles—

As the phosphorous-containing copper alloy, a brazing material called copper phosphorus brazing (phosphorous concentration: approximately 7% by mass or less) is known. The copper phosphorus brazing is used as a copper to copper bonding agent, but by using the phosphorous-containing copper alloy particles as the copper-containing particles included in the paste composition for an electrode according to the present invention, the oxidation resistance is excellent and an electrode having a low resistivity can be formed. Furthermore, it becomes possible to sinter the electrode at a low temperature, and as a result, an effect of reducing a process cost can be attained.

In the present invention, the content of phosphorous included in the phosphorous-containing copper alloy is not limited as long as it has a content such that in the simultaneous ThermoGravimetry/Differential Thermal Analysis, the peak temperature of the exothermic peak showing a maximum area becomes 280° C. or higher. Specifically, it can be 0.01% by mass or more based on the total mass of the phosphorous-containing copper alloy particles. In the present invention, from the viewpoint of the oxidation resistance and the low resistivity, the content of phosphorous is preferably from 0.01% by mass to 8% by mass, more preferably from 0.5% by mass to 7.8% by mass, and even more preferably from 1% by mass to 7.5% by mass.

By setting the content of phosphorous included in the phosphorous-containing copper alloy to 8% by mass or less, a lower resistivity can be attained, and also, the productivity of the phosphorous-containing copper alloy is excellent. Further, by setting the content of phosphorous included in the phosphorous-containing copper alloy to 0.01% by mass or more, superior oxidation resistance can be attained.

Although the phosphorous-containing copper alloy particle is an alloy including copper and phosphorous, it may have other atoms. Examples of other atoms include Sb, Si, K, Na, Li, Ba, Sr, Ca, Mg, Be, Zn, Pb, Cd, Tl, V, Sn, Al, Zr, W, Mo, Ti, Co, Ni, and Au. Among these, from the viewpoint of adjustment of characteristics such as the oxidation resistance and a melting point, Al is preferably included.

Furthermore, the content of other atoms included in the phosphorous-containing copper alloy particles can be set to, for example, 3% by mass or less in the phosphorous-containing copper alloy particles, and from the viewpoint of the oxidation resistance and the low resistivity, it is preferably 1% by mass or less.

The particle diameter of the phosphorous-containing copper alloy particle is not particularly limited, and it is preferably from 0.4 to 10 μm, and more preferably from 1 to 7 μm in terms of a particle diameter when the cumulative weight is 50% (hereinafter abbreviated as "D50%" in some cases). By setting the particle diameter to 0.4 μm or more, the oxidation resistance is improved more effectively. Further, by setting the particle diameter to 10 μm or less, the contact area at where the phosphorous-containing copper alloy particles contact each other in the electrode increases, whereby the resistivity is reduced more effectively.

In addition, the shape of the phosphorous-containing copper alloy particle is not particularly limited, and it may be any one of an approximately spherical shape, a flat shape, a block shape, a plate shape, a scale-like shape, and the like. From the viewpoint of the oxidation resistance and the low resistivity, the shape of the phosphorous-containing copper alloy particle is preferably an approximately spherical shape, a flat shape, or a plate shape.

The phosphorous copper alloy can be prepared by a generally used method. Further, the phosphorous-containing copper alloy particle can be prepared by a general method for preparing metal powders using a phosphorous-containing copper alloy that is prepared so as to give a desired phosphorous content, and it can be prepared by, for example, a general method using a water atomization method. The water atomization method is described in Handbook of Metal (MARUZEN CO., LTD. Publishing Dept.) or the like.

Specifically, for example, a desired phosphorous-containing copper alloy particle can be prepared by dissolving a phosphorous-containing copper alloy, forming a powder by nozzle spray, drying the obtained powders, and classifying them. Further, a phosphorous-containing copper alloy particle having a desired particle diameter can be prepared by appropriately selecting the classification condition.

The content of the phosphorous-containing copper alloy particles, and when including silver particles as described later, the total content of the phosphorous-containing copper alloy particles and the silver particles, which are respectively included in the paste composition for an electrode according to the present invention, can be, for example, from 70 to 94% by mass, and from the viewpoint of the oxidation resistance and the low resistivity, it is preferably from 72 to 90% by mass, and more preferably from 74 to 88% by mass.

Furthermore, in the present invention, the phosphorous-containing copper alloy particles may be used singly or in combination of two or more kinds thereof. In addition, they may be used in combination with the copper-containing particles, having a peak temperature in the exothermic peak showing a maximum area of 280° C. or higher, other than the phosphorous copper alloy particles.

Moreover, in the present invention, from the viewpoint of the oxidation resistance and the low resistivity of the electrode, it is preferable that the phosphorous-containing copper alloy particles having a phosphorous content from 0.01% by mass to 8% by mass be contained in an amount of from 70 to 94% by mass based on the paste composition for an electrode, and it is more preferable that the phosphorous-containing copper alloy particles having a phosphorous content of from 1 to 7.5% by mass be contained in an amount of from 74 to 88% by mass based on the paste composition for an electrode.

Further, in the present invention, conductive particles other than the phosphorous-containing copper alloy particles may be used in combination therewith.

—Silver-Coated Copper Particles—

As the silver-coated copper particle in the present invention, any one in which at least a part of the copper particle surface is coated with silver is suitable. By using the silver-coated copper particles as the copper-containing particles included in the paste composition for an electrode according to the present invention, the oxidation resistance is excellent and an electrode having a low resistivity can be formed. Further, by coating the copper particle with silver, the interfacial resistance between the silver-coated copper particle and the silver particle is reduced, and thus, an electrode having a further reduced resistivity can be formed. In addition, when moisture is incorporated during the formation of a paste composition, an effect that the oxidation of copper at room temperature can be inhibited by using the silver-coated copper particles and the pot life can be enhanced can be obtained.

The coating amount of silver (silver content) in the silver-coated copper particles is preferably a coating amount (silver content) such that in the simultaneous ThermoGravimetry/Differential Thermal Analysis, the peak temperature of the exothermic peak showing a maximum area may be 280° C. or higher. Specifically, the coating amount of silver is 1% by mass or more based on the total mass of the silver-coated copper particles, but from the viewpoint of the oxidation resistance and the low resistivity of the electrode, it is preferably from 1 to 88% by mass, more preferably from 3 to 80% by mass, and even more preferably from 5 to 75% by mass, based on the total mass of the silver-coated copper particles.

Furthermore, the particle diameter of the silver-coated copper particle is not particularly limited, and it is preferably from 0.4 μm to 10 μm, and more preferably from 1 to 7 μm in terms of a particle diameter when the cumulative weight is 50% (hereinafter abbreviated as "D50%" in some cases). By setting the particle diameter to 0.4 μm or more, the oxidation resistance is improved more effectively. Further, by setting the particle diameter to 10 μm or less, the contact area at which the silver-coated copper particles contact each other in the electrode increases, whereby the resistivity is reduced more effectively.

In addition, the shape of the silver-coated copper particle is not particularly limited, and it may be any one of an approximately spherical shape, a flat shape, a block shape, a plate shape, a scale-like shape, and the like, but from the viewpoint of the oxidation resistance and the low resistivity, it is preferably an approximately spherical shape, a flat shape, or a plate shape.

Copper constituting the silver-coated copper particle may contain other atoms. Examples of other atoms include Sb, Si, K, Na, Li, Ba, Sr, Ca, Mg, Be, Zn, Pb, Cd, Ti, V, Sn, Al, Zr, W, Mo, Ti, Co, Ni, and Au. Among these, from the viewpoint of adjustment of the characteristics such as the oxidation resistance and a melting point, Al is preferably included.

Further, the content of other atoms contained in the silver-coated copper particle can be, for example, 3% by mass or less in the silver-coated copper particle, and from the viewpoint of the oxidation resistance and the low resistivity, it is preferably 1% by mass or less.

Furthermore, it is also preferable that the silver-coated copper particle be one obtained by coating the above-described phosphorous-containing copper alloy with silver. Consequently, the oxidation resistance is further improved, and thus, the resistivity of the electrode formed is further reduced.

Details on the phosphorous-containing copper alloy in the silver-coated copper particles and preferred embodiments thereof are the same as for the above-described phosphorous-containing copper alloy.

The method for preparing the silver-coated copper particles is not particularly limited as long as it is a preparation method in which at least a part of the surface of the copper particles (preferably phosphorous-containing copper alloy particles) can be coated with silver. For example, the silver-coated copper particles can be prepared by the following method. That is, copper powders (or phosphorous-containing copper alloy powders) are dispersed in an acidic solution such as sulfuric acid, hydrochloric acid, and phosphoric acid, and a chelator is added to the copper powder dispersion, thereby preparing a copper powder slurry. By adding a silver ion solution to the copper powder slurry obtained, a silver layer can be formed on the copper powder surface by a substitution reaction, thereby preparing silver-coated copper particles.

The chelator is not particularly limited, and, for example, ethylene diamine tetraacetate, triethylene diamine, diethylene triamine pentaacetate, imino diacetate, or the like can be used. Further, as the silver ion solution, for example, a silver nitrate solution, or the like can be used.

The content of the silver-coated copper particles, and when including silver particles as described later, the total content of the silver-coated copper particles and the silver particles, which are respectively included in the paste composition for an electrode according to the present invention, can be, for example, from 70 to 94% by mass, and from the viewpoint of the oxidation resistance and low resistivity, it is preferably from 72 to 90% by mass, and more preferably from 74 to 88% by mass.

Furthermore, in the present invention, the silver-coated copper particles may be used singly or in combination of two or more kinds thereof. In addition, they may be used in combination with the copper-containing particles, having a peak temperature in the exothermic peak showing a maximum area of 280° C. or higher, other than the silver-coated copper particles.

In the present invention, from the viewpoint of the oxidation resistance and the low resistivity of the electrode, it is preferable that the silver-coated copper particles having a silver content of from 1 to 88% by mass based on the total mass of the silver-coated copper particle be contained in an amount of from 70 to 94% by mass (the total content of the silver-coated copper particles and the silver particles when including the silver particles as described later) based on the paste composition for an electrode, and it is more preferable that the silver-coated copper particles having a silver content of from 5 to 75% by mass be contained in an amount of from 74 to 88% by mass (the total content of the silver-coated copper particles and the silver particles when including the silver particles as described later) based on the paste composition for an electrode.

Furthermore, it is preferable that the silver-coated phosphorous-containing copper alloy particles having a silver content of from 1 to 88% by mass and a phosphorous content from 0.01 to 8% by mass be contained in an amount of from 70 to 94% by mass (the total content of the silver-coated phosphorous-containing copper alloy particles and the silver particles when including the silver particles as described later) based on the paste composition for an electrode, and it is more preferable that the silver-coated phosphorous-containing copper alloy particles having a silver content of from 5% by mass to 75% by mass and a phosphorous content from 1 to 7.5% by mass be contained in an amount of from 74 to 88% by mass (the total content of the silver-coated phosphorous-containing copper alloy particles and the silver particles when including the silver particles as described later) based on the paste composition for an electrode.

Further, in the present invention, conductive particles other than the silver-coated copper particles may be used in combination therewith.

—Surface-Treated Copper Particles—

The copper-containing particles in the present invention are also preferably copper particles that have been surface-treated with at least one selected from a group consisting of a triazole compound, a saturated fatty acid, an unsaturated fatty acid, an inorganic metal compound salt, an organic metal compound salt, a polyaniline-based resin, and a metal alkoxide (hereinafter referred to as the "surface treatment agent" in some cases), and more preferably copper particles that have been surface-treated with at least one selected from a group consisting of a triazole compound, a saturated fatty acid, an unsaturated fatty acid, and an inorganic metal compound salt.

By using the copper particles which have been surface-treated with at least one kind of surface treatment agent as the copper-containing particles included in the paste composition for an electrode according to the present invention, the oxidation resistance is excellent and an electrode having a low resistivity can be formed. In addition, when forming a paste composition, when moisture is incorporated, an effect that oxidation of copper at room temperature can be inhibited by using the surface treatment agent and the pot life can be enhanced can be obtained.

Furthermore, in the present invention, the surface treatment agents may be used singly or in combination of two or more kinds thereof.

In the present invention, the surface-treated copper particles are surface-treated with at least one selected from the group consisting of a triazole compound, a saturated fatty acid, an unsaturated fatty acid, an inorganic metal compound salt, an organic metal compound salt, a polyaniline-based resin, and a metal alkoxide, but if necessary, other surface treatment agents may be used together therewith.

Examples of the triazole compound in the surface treatment agent include benzotriazole and triazole. Further, examples of the saturated fatty acid in the surface treatment agent include enanthic acid, caprylic acid, pelargonic acid, capric acid, undecylic acid, lauric acid, tridecyl acid, myristic acid, pentadecyl acid, stearic acid, nonadecanoic acid, arachic acid, and behenic acid. Further, examples of the unsaturated fatty acid in the surface treatment agent include acrylic acid, methacrylic acid, crotonic acid, isocrotonic acid, undecylenic acid, oleic acid, elaidic acid, cetoleic acid, brassidic acid, erucic acid, sorbic acid, linoleic acid, linolenic acid, and arachidonic acid.

Moreover, examples of the inorganic metal compound salt in the surface treatment agent include sodium silicate, sodium stannate, tin sulfate, zinc sulfate, sodium zincate, zirconium nitrate, sodium zirconate, zirconium oxide chloride, titanium sulfate, titanium chloride, and potassium oxalate titanate. Further, examples of the organic metal compound salt in the surface treatment agent include lead stearate, lead acetate, a p-cumylphenyl derivative of tetraalkoxyzirconium, and a p-cumylphenyl derivative of tetraalkoxytitanium. In addition, examples of the metal alkoxide in the surface treatment agent include titanium alkoxide, zirconium alkoxide, lead alkoxide, silicon alkoxide, tin alkoxide, and indium alkoxide.

Examples of other surface treatment agents include dodecyl benzene sulfonic acid. Further, when stearic acid or lead stearate is used as the surface treatment agent, at least one of stearic acid and lead stearate can be used in combination with lead acetate as the surface treatment agent to form an electrode having further improved oxidation resistance and thus having a lower resistivity.

As the surface-treated copper particle in the present invention, any one in which at least a part of the surface of the copper particles is coated with at least one kind of the surface treatment agents is suitable. The content of the surface treatment agent contained in the surface-treated copper particle is preferably a content such that the peak temperature of the exothermic peak showing a maximum area in the simultaneous ThermoGravimetry/Differential Thermal Analysis is 280° C. or higher. Specifically, the content is 0.01% by mass or more based on the total mass of the surface-treated copper particles, but from the viewpoint of the oxidation resistance and the low resistivity of the electrode, it is preferably from 0.01 to 10% by mass, and more preferably, from 0.05 to 8% by mass, based on the total mass of the copper particles.

Copper constituting the surface-treated copper particles may contain other atoms. Examples of other atoms include Sb, Si, K, Na, Li, Ba, Sr, Ca, Mg, Be, Zn, Pb, Cd, Tl, V, Sn, Al, Zr, W, Mo, Ti, Co, Ni, and Au. Among these, from the viewpoint of adjustment of the characteristics such as the oxidation resistance and a melting point, Al is preferably included.

In addition, the content of other atoms contained in the surface-treated copper particle can be, for example, 3% by mass or less in the surface-treated copper particle, and from the viewpoint of the oxidation resistance and the low resistivity, it is preferably 1% by mass or less.

Furthermore, it is also preferable that the surface-treated copper particles be those obtained by subjecting the above-described phosphorous-containing copper alloy to a surface treatment. Consequently, the oxidation resistance is further improved, and thus, the resistivity of the electrode formed is further reduced.

Details on the phosphorous-containing copper alloy in the surface-treated copper particles and preferred embodiments thereof are the same as for the above-described phosphorous-containing copper alloy.

Furthermore, the particle diameter of the surface-treated copper particle is not particularly limited, and it is preferably from 0.4 μm to 10 μm, and more preferably from 1 μm to 7 μm in terms of a particle diameter when the cumulative weight is 50% (hereinafter abbreviated as "D50%" in some cases). By setting the particle diameter to 0.4 μm or more, the oxidation resistance is improved more effectively. Further, by setting the particle diameter to 10 μm or less, the contact area between the surface-treated copper particles in the electrode increases, and thus, the resistivity is reduced more effectively.

In addition, the shape of the surface-treated copper particle is not particularly limited, and it may be any one of an approximately spherical shape, a flat shape, a block shape, a plate shape, a scale-like shape, and the like. From the viewpoint of the oxidation resistance and the low resistivity, the shape of the surface-treated copper particle is preferably an approximately spherical shape, a flat shape, or a plate shape.

The method for the surface treatment of the copper particles using a surface treatment agent can be appropriately selected according to the surface treatment agent to be used. For example, a surface treatment solution in which a surface treatment agent is dissolved in a solvent capable of dissolving the surface treatment agent is prepared, and copper particles are immersed therein and then dried, whereby at least a part of the surface of the copper particles can be coated with the surface treatment agent.

The solvent capable of dissolving the surface treatment agent can be appropriately selected depending on the surface treatment agent. Examples of the solvent include water, alcohol-based solvents such as methanol, ethanol, and isopropanol, glycol-based solvents such as ethylene glycol monoethyl ether, carbitol-based solvents such as diethylene glycol monobutyl ether, and carbitol acetate-based solvents such as diethylene glycol monoethyl ether acetate.

Specifically, for example, when benzotriazole, triazole, or dodecyl benzene sulfonic acid is used as the surface treatment agent, a surface treatment solution can be prepared using the alcohol-based solvent, thereby subjecting the copper particles to a surface treatment.

In addition, when stearic acid or lead stearate is used as the surface treatment agent, a surface treatment solution can be prepared using the alcohol-based solvent.

The concentration of the surface treatment agent in the surface treatment solution can be appropriately selected depending on the kind of the surface treatment agent used and a desired extent of the surface treatment. For example, the concentration can be from 1 to 90% by mass, and preferably from 2 to 85% by mass.

The content of the surface-treated copper particles, and when including silver particles as described later, the total content of the surface-treated copper particles and the silver particles, which are respectively included in the paste composition for an electrode according to the present invention, can be, for example, from 70 to 94% by mass, and from the viewpoint of the oxidation resistance and the low resistivity, it is preferably from 72 to 90% by mass, and more preferably from 74 to 88% by mass.

Furthermore, in the present invention, the surface-treated copper particles may be used singly or in combination of two or more kinds thereof. In addition, they may be used in combination with the copper-containing particles, having a peak temperature in the exothermic peak showing a maximum area of 280° C. or higher, other than the surface-treated copper particles.

In the present invention, from the viewpoint of the oxidation resistance and the low resistivity of the electrode, it is preferable that the copper particles, in which at least one selected from the group consisting of a triazole compound, a saturated fatty acid, an unsaturated fatty acid, an inorganic metal compound salt, an organic metal compound salt, a polyaniline-based resin, and a metal alkoxide is subjected to from 0.01 to 10% by mass surface treatment, be contained in an amount of from 70 to 94% by mass (the total content of the surface-treated copper particles and the silver particles when including the silver particles as described later) based on the paste composition for an electrode, and it is more preferable that the copper particles, in which at least one selected from the group consisting of a triazole compound, a saturated fatty acid, an unsaturated fatty acid, and an inorganic metal compound salt is subjected to from 0.05 to 8% by mass surface treatment, be contained in an amount of from 74 to 88% by mass (the total content of the surface-treated copper particles and the silver particles when including the silver particles as described later) based on the paste composition for an electrode.

Furthermore, it is preferable that the phosphorous-containing copper alloy particles, in which at least one selected from the group consisting of a triazole compound, a saturated fatty acid, an unsaturated fatty acid, an inorganic metal compound salt, an organic metal compound salt, a polyaniline-based resin, and a metal alkoxide is subjected to from 0.01 to 10% by mass surface treatment and the phosphorous content is 8% by mass or less, be contained in an amount of from 70 to 94% by mass (the total content of the surface-treated phosphorous-containing copper alloy particles and the silver particles when including the silver particles as described later) based on the paste composition for an electrode, and it is more preferable that the phosphorous-containing copper alloy particles, in which at least one selected from the group consisting of a triazole compound, a saturated fatty acid, an unsaturated fatty acid, and an inorganic metal compound salt is subjected to from 0.05 to 8% by mass and the phosphorous content is from 1 to 7.5% by mass or less, be contained in an amount of from 74 to 88% by mass (the total content of the surface-treated phosphorous-containing copper alloy particles and the silver particles when including the silver particles as described later) based on the paste composition for an electrode.

Further, in the present invention, conductive particles other than the surface-treated copper particles may be used in combination therewith.

(Glass Particles)

The paste composition for an electrode according to the present invention includes at least one kind of glass particles. By incorporating glass particles in the paste composition for an electrode, a silicon nitride film which is an anti-reflection film is removed by a so-called fire-through at an electrode-forming temperature, and an ohmic contact between the electrode and the silicon substrate is formed.

As the glass particle, any known glass particles in the related art may be used without any particular limitation, provided the glass particles softened or melted at an electrode-forming temperature to contact with the silicon nitride, thereby oxidizing the silicon nitride and incorporating the oxidized silicon dioxide thereof.

In the present invention, from the viewpoint of the oxidation resistance and the low resistivity of the electrode, a glass particle containing glass having a glass softening point of 600° C. or lower and a crystallization starting temperature of higher than 600° C. is preferred. Further, the glass softening point is measured by a general method using a ThermoMechanical Analyzer (TMA), and the crystallization starting temperature is measured by a general method using a ThermoGravimetry/Differential Thermal Analyzer (TG/DTA).

The glass particles generally included in the paste composition for an electrode may be constituted with lead-containing glass, at which silicon dioxide can be efficiently incorporated. Examples of such lead-containing glass include those described in Japanese Patent No. 03050064 and the like, which can be suitably used in the present invention.

Furthermore, in the present invention, in consideration of the effect on the environment, it is preferable to use lead-free glass which does not substantially contain lead. Examples of the lead-free glass include lead-free glass described in Paragraphs 0024 to 0025 of JP-A No. 2006-313744, and lead-free glass described in JP-A No. 2009-188281 and the like, and it is also preferable to appropriately select one from the lead-free glass as above and apply it in the present invention.

Moreover, the glass particles preferably include glass containing diphosphorus pentoxide (phosphoric acid glass, $P_2O_5$-based glass), and more preferably glass further containing divanadium pentoxide in addition to diphosphorus pentoxide ($P_2O_5$—$V_2O_5$-based glass), from the viewpoint of the low contact resistivity. By further including divanadium pentoxide, the oxidation resistance is further improved, and the resistivity of the electrode is further reduced. It is thought that this is caused by, for example, declination in the softening point of glass by further including divanadium pentoxide.

When the glass particles include diphosphorus pentoxide-divanadium pentoxide-based glass ($P_2O_5$—$V_2O_5$-based glass), the content of divanadium pentoxide is preferably 1% by mass or more based on the total mass of glass, and more preferably from 1 to 70% by mass.

Moreover, the diphosphorus pentoxide-divanadium pentoxide-based glass can further include other components, if necessary. Examples of other components include barium oxide (BaO), manganese dioxide ($MnO_2$), sodium oxide ($Na_2O$), potassium oxide ($K_2O$), zirconium dioxide ($ZrO_2$), tungsten trioxide ($WO_3$), tellurium oxide (TeO), molybdenum trioxide ($MoO_3$), and diantimony trioxide ($Sb_2O_3$). By further including other components, silicon dioxide derived from the silicon nitride can be more efficiently incorporated. Further, the softening or melting temperature can be further reduced. In addition, the reaction with the copper-containing particles or silver particles that are added, if necessary, can be inhibited.

It is also preferable that the glass particles be glass particles not containing divanadium pentoxide. By not including divanadium pentoxide, the glass particles can be inhibited from being rapidly softened when heating the paste composition for an electrode, and a more homogeneous electrode can be formed.

Examples of the glass component constituting the glass particles not containing divanadium pentoxide include silicon dioxide ($SiO_2$), phosphorous oxide ($P_2O_5$), aluminum oxide ($Al_2O_3$), boron oxide ($B_2O_3$), potassium oxide ($K_2O$), sodium oxide ($Na_2O$), lithium oxide ($Li_2O$), barium oxide (BaO), strontium oxide (SrO), calcium oxide (CaO), magnesium oxide (MgO), beryllium oxide (BeO), zinc oxide (ZnO), lead oxide (PbO), cadmium oxide (CdO), tin oxide (SnO), zirconium oxide ($ZrO_2$), tungsten oxide ($WO_3$), molybdenum oxide ($MoO_3$), lanthanum oxide ($La_2O_3$), niobium oxide ($Nb_2O_5$), tantalum oxide ($Ta_2O_5$), yttrium oxide ($Y_2O_3$), titanium oxide ($TiO_2$), germanium oxide ($GeO_2$), tellurium oxide ($TeO_2$), and lutetium oxide ($Lu_2O_3$). Among these, at least one selected from $SiO_2$, $P_2O_5$, $Al_2O_3$, $B_2O_3$, $K_2O$, $Na_2O$, $Li_2O$, BaO, SrO, CaO, MgO, BeO, ZnO, PbO, CdO, SnO, $ZrO_2$, $WO_3$, and $MoO_3$ is preferably used, and at least one selected from $SiO_2$, $P_2O_5$, $Al_2O_3$, $B_2O_3$, ZnO, and PbO is more preferably used.

The content of the glass particles is preferably from 0.1 to 10% by mass, more preferably from 0.5 to 8% by mass, and even more preferably from 1 to 7% by mass, based on the total mass of the paste composition for an electrode. By incorporating glass particles at a content in this range, the oxidation resistance, the low resistivity of the electrode, and the low contact resistance can be attained more effectively.

In the present invention, it is preferable to include glass particles including $P_2O_5$—$V_2O_5$-based glass in an amount of from 0.1 to 10% by mass, it is more preferable to include glass particles including $P_2O_5$—$V_2O_5$-based glass having a content of $V_2O_5$ of 1% by mass or more in an amount of from 0.5 to 8% by mass, and it is even more preferable to include glass particles including $P_2O_5$—$V_2O_5$-based glass having a content of $V_2O_5$ of 1% by mass or more in an amount of from 1 to 7% by mass.

Further, it is preferable to include glass particles containing at least one selected from $SiO_2$, $Al_2O_3$, $B_2O_3$, $K_2O$, $Na_2O$, $Li_2O$, BaO, SrO, CaO, MgO, BeO, ZnO, PbO, CdO, SnO, $ZrO_2$, $WO_3$, and $MoO_3$ in an amount of from 0.1 to 10% by mass as the glass particles, and it is more preferable to include glass particles containing at least one selected from $SiO_2$, $Al_2O_3$, $B_2O_3$, ZnO, and PbO in an amount of from 1 to 7% by mass.

(Solvent and Resin)

The paste composition for an electrode according to the present invention includes at least one kind of solvent and at least one kind of resin, thereby enabling adjustment of the liquid physical properties (for example, viscosity and surface tension) of the paste composition for an electrode according to the present invention due to application method, when selected the paste composition is provided to the silicon substrate.

The solvent is not particularly limited. Examples thereof include hydrocarbon-based solvents such as hexane, cyclohexane, and toluene; chlorinated hydrocarbon-based solvents such as dichloroethylene, dichloroethane, and dichlorobenzene; cyclic ether-based solvents such as tetrahydrofuran, furan, tetrahydropyran, pyran, dioxane, 1,3-dioxolane, and trioxane; amide-based solvents such as N,N-dimethylformamide and N,N-dimethylacetamide; sulfoxide-based solvents such as dimethylsulfoxide, diethylsulfoxide; ketone-based solvents such as acetone, methyl ethyl ketone, diethyl ketone, and cyclohexanone; alcohol-based compounds such as ethanol, 2-propanol, 1-butanol, and diacetone alcohol; polyhydric alcohol ester-based solvents such as 2,2,4-trimethyl-1,3-pentanediol monoacetate, 2,2,4-trimethyl-1,3-pentanediol monopropionate, 2,2,4-trimethyl-1,3-pentanediol monobutyrate, 2,2,4-trimethyl-1,3-pentanediol monoisobutyrate, 2,2,4-triethyl-1,3-pentanediol monoacetate, ethylene glycol monobutyl ether acetate, and diethylene glycol monobutyl ether acetate; polyhydric alcohol ether-based solvents such as butyl cellosolve and diethylene glycol diethyl ether; terpene-based solvents such as α-terpinene, α-terpineol, myrcene, alloocimene, limonene, dipentene, α-pinene, β-pinene, terpineol, carvone, ocimene, and phellandrene, and mixtures thereof.

As the solvent in the present invention, from the viewpoint of applicability and printability when forming the paste composition for an electrode on a silicon substrate, at least one selected from polyhydric alcohol ester-based solvents, terpene-based solvents, and polyhydric alcohol ether-based solvents is preferred, and at least one selected from polyhydric alcohol ester-based solvents and terpene-based solvents is more preferred.

In the present invention, the solvents may be used singly or in combination of two or more kinds thereof.

Furthermore, as the resin, a resin that is generally used in the art can be used without any limitation as long as it is a resin that is thermally decomposable by sintering. Specific examples thereof include cellulose-based resins such as methyl cellulose, ethyl cellulose, carboxymethyl cellulose, and nitrocellulose; polyvinyl alcohols; polyvinyl pyrrolidones; acryl resins; vinyl acetate-acrylic ester copolymers; butyral resins such as polyvinyl butyral; alkyd resins such as phenol-modified alkyd resins and castor oil fatty acid-modified alkyd resins; epoxy resins; phenol resins; and rosin ester resins.

As the resin in the present invention, from the viewpoint of the loss at a time of sintering, at least one selected from cellulose-based resins and acryl resins is preferred, and at least one selected from cellulose-based resins is more preferred.

In the present invention, the resins may be used singly or in combination of two or more kinds thereof.

In the paste composition for an electrode according to the present invention, the contents of the solvent and the resin can be appropriately selected in accordance with desired liquid physical properties, and the kinds of the solvent and the resin to be used. For example, the total content of the solvent and the resin is preferably from 3% by mass to 29.9% by mass, more preferably from 5% by mass to 25% by mass, and even more preferably from 7% by mass to 20% by mass, based on the total mass of the paste composition for an electrode.

By setting the total content of the solvent and the resin in the above-described ranges, the provision suitability becomes better when the paste composition for an electrode is provided to a silicon substrate, and thus, an electrode having a desired width and a desired height can be formed more easily.

(Silver Particles)

The paste composition for an electrode according to the present invention preferably further includes at least one kind of silver particle. By including the silver particle, the oxidation resistance is further improved, and the resistivity as the electrode is further reduced. In addition, an effect that the solder connectivity is improved when forming a photovoltaic cell module can be obtained. This can be considered to be as follows, for example.

Generally, in a temperature region from 600° C. to 900° C., which is an electrode-forming temperature region, a small amount of a solid solution of silver in copper, and a small amount of a solid solution of copper in silver are generated, and a layer of the copper-silver solid solution (solid solution region) is formed at an interface between copper and silver. When a mixture of the copper-containing particles and the silver particles is heated at a high temperature, and then slowly cooled to room temperature, it is thought that the solid solution region is not generated. However when forming an electrode, since cooling is carried out for a few seconds from a high temperature region to a room temperature when forming an electrode, it is thought that the layer of the solid solution at a high temperature covers the surface of the silver particles and the copper-containing particles as a non-equilibrium solid solution phase or as a eutectic structure of copper and silver. It is assumed that such a copper-silver solid solution layer contributes to the oxidation resistance of the copper-containing particle at an electrode-forming temperature.

Further, the copper-silver solid solution layer starts to form at a temperature of from 300° C. to 500° C. or higher. Accordingly, it is thought that by using the silver particles in combination with the copper-containing particles whose peak temperature of the exothermic peak having a maximum area is 280° C. or higher measured in the simultaneous Thermo-Gravimetry/Differential Thermal Analysis, whereby the oxidation resistance of the copper-containing particles can be improved more effectively, and the resistivity of the electrode to be formed is further reduced.

Silver constituting the silver particles may contain other atoms which are inevitably incorporated. Examples of other atoms which are inevitably incorporated include Sb, Si, K, Na, Li, Ba, Sr, Ca, Mg, Be, Zn, Pb, Cd, Tl, V, Sn, Al, Zr, W, Mo, Ti, Co, Ni, and Au.

The particle diameter of the silver particle in the present invention is not particularly limited, and it is preferably from 0.4 µm to 10 µm, and more preferably from 1 µm to 7 µm in terms of a particle diameter when the cumulative mass is 50% (D50%). When the particle diameter is 0.4 µm or more, the oxidation resistance is improved more effectively. Further, when the particle diameter is 10 µm or less, the contact area at which the metal particles such as silver particles and copper-containing particles contact each other in the electrode increases, and thus, the resistivity is reduced more effectively.

In the paste composition for an electrode according to the present invention, the relationship between the particle diameter (D50%) of the copper-containing particle and the particle diameter (D50%) of the silver particle is not particularly limited, and it is preferable that the particle diameter (D50%) of one is smaller than the particle diameter (D50%) of the other, and it is more preferable that the ratio of the particle diameter of one of the copper-containing particle and the silver particle with respect to the particle diameter of the other of the copper-containing particle and the silver particle be from 1 to 10. Consequently, the resistivity of the electrode is reduced more effectively. It can be thought that this is caused by, for example, an increase in the contact area between the metal particles such as copper-containing particles and silver particles in the electrode.

Moreover, the content of the silver particles in the paste composition for an electrode according to the present invention is preferably from 8.4 to 85.5% by mass, and more preferably from 8.9 to 80.1% by mass, based on the paste composition for an electrode, from the viewpoint of the oxidation resistance and the low resistivity of the electrode.

Further, in the present invention, from the viewpoint of the oxidation resistance and the low resistivity of the electrode, the content of the copper-containing particles when the total amount of the copper-containing particles and the silver particles are taken as 100% by mass is preferably from 9 to 88% by mass, and more preferably from 17 to 77% by mass.

By setting the content of the copper-containing particles to 9% by mass or more, in a case in which the glass particles include divanadium pentoxide, a reaction between silver and vanadium is suppressed, which results in a reduction of the volume resistance of the electrode. Also, when a silicon substrate for forming an electrode is treated by an aqueous hydrofluoric acid solution for the purpose of improving the energy conversion efficiency of a photovoltaic cell, the above content of the copper-containing particles leads to improvement in the resistance of the electrode material against the aqueous hydrofluoric acid solution (this property means that the electrode material dose not peeled from the silicon substrate due to the aqueous hydrofluoric acid solution).

Further, by setting the content of the copper-containing particles to 88% by mass or less, copper included in the copper-containing particles is further inhibited from being in contact with the silicon substrate, thereby further reducing the contact resistance of the electrode.

Moreover, in the paste composition for an electrode according to the present invention, from the viewpoint of the oxidation resistance, the low resistivity of the electrode, and the applicability on a silicon substrate, the total content of the copper-containing particles and the silver particles is preferably from 70% by mass to 94% by mass, and more preferably from 74% by mass to 88% by mass. By setting the total content of the copper-containing particles and the silver particles to 70% by mass or more, a viscosity that is suitable for providing the paste composition for an electrode can be easily attained. Also, by setting the total content of the copper-containing particles and the silver particles to 94% by mass or less, occurrence of abrasion when providing the paste composition for an electrode can be inhibited more effectively.

Moreover, in the paste composition for an electrode according to the present invention, from the viewpoint of the oxidation resistance and the low resistivity of the electrode, it is preferable that the total content of the copper-containing particles and the silver particles be from 70% by mass to 94% by mass, the content of the glass particles be from 0.1% by mass to 10% by mass, and the total content of the solvent and the resin be from 3% by mass to 29.9% by mass, it is more preferable that the total content of the copper-containing particles and the silver particles be from 74% by mass to 88% by mass, the content of the glass particles be from 0.5% by mass to 8% by mass, and the total content of the solvent and the resin be from 7% by mass to 20% by mass, and it is even more preferable that the total content of the copper-containing particles and the silver particles be from 74% by mass to 88% by mass, the content of the glass particles be from 1% by mass to 7% by mass, and the total content of the solvent and the resin be from 7% by mass to 20% by mass.

(Phosphorous-Containing Compound)

The paste composition for an electrode according to the present invention preferably includes at least one kind of phosphorous-containing compound. Consequently, the oxidation resistance is improved more effectively, and the resistivity of the electrode is further reduced. Further, in the silicon substrate, there can be obtained an effect that the elements in the phosphorous-containing compound are diffused as an n-type dopant, and the power generation efficiency is also improved when forming a photovoltaic cell.

The phosphorous-containing compound is preferably a compound having a high content of phosphorous atoms in the molecule, from the viewpoint of the oxidation resistance and the low resistivity of the electrode, which does not cause evaporation or decomposition under the condition of a temperature of around 200° C.

Specific examples of the phosphorous-containing compound include phosphorous-based inorganic acids such as phosphoric acid, phosphates such as ammonium phosphate, phosphoric esters such as phosphoric acid alkyl ester and phosphoric acid aryl ester, cyclic phosphazenes such as hexaphenoxyphosphazene, and derivatives thereof.

The phosphorous-containing compound in the present invention is preferably phosphoric acid, ammonium phosphate, phosphoric ester, and cyclic phosphazene, and more preferably at least one selected from the group consisting of phosphoric ester, and cyclic phosphazene, from the viewpoint of the oxidation resistance and the low resistivity of the electrode.

The content of the phosphorous-containing compound in the present invention is preferably from 0.5 to 10% by mass, and more preferably from 1 to 7% by mass, based on the total mass of the paste composition for an electrode, from the viewpoint of the oxidation resistance and the low resistivity of the electrode.

Further, in the present invention, it is preferable to include at least one selected from the group consisting of phosphoric acid, ammonium phosphate, phosphoric ester, and cyclic phosphazene in an amount of from 0.5 to 10% by mass based on the total mass of the paste composition for an electrode as the phosphorous-containing compound, and it is more preferable to include at least one selected from the group consisting of phosphoric ester, and cyclic phosphazene in an amount of from 1 to 7% by mass based on the total mass of the paste composition for an electrode.

Moreover, when the paste composition for an electrode according to the present invention includes the phosphorous-containing compound, from the viewpoint of the oxidation resistance and the low resistivity of the electrode, it is preferable that the total content of the copper-containing particles and the silver particles be from 70% by mass to 94% by mass, the content of the glass particles be from 0.1% by mass to 10% by mass, and the total content of the solvent, the resin, and the phosphorous-containing compound be from 3% by mass to 29.9% by mass, it is more preferable that the total content of the copper-containing particles and the silver particles be from 74% by mass to 88% by mass, the content of the glass particles be from 0.5% by mass to 8% by mass, and the total content of the solvent, the resin, and the phosphorous-containing compound be from 7% by mass to 20% by mass, and it is even more preferable that the total content of the copper-containing particles and the silver particles be from 74% by mass to 88% by mass, the content of the glass particles be from 1% by mass to 7% by mass, and the total content of the solvent, the resin, and the phosphorous-containing compound be from 7% by mass to 20% by mass.

(Flux)

The paste composition for an electrode can include at least one kind of flux. By including the flux, the oxidation resistance is further improved, and the resistivity of the electrode formed is further reduced. Also, an effect that adhesion between the electrode material and the silicon substrate is improved can be attained.

The flux in the present invention is not particularly limited as long as it can remove an oxide film formed on the surface of the copper-containing particle. Specific preferable examples of the flux include fatty acids, boric acid compounds, fluoride compounds, and fluoroborate compounds.

More specific examples thereof include lauric acid, myristic acid, palmitic acid, stearic acid, sorbic acid, stearol acid, boron oxide, potassium borate, sodium borate, lithium borate, potassium fluoroborate, sodium fluoroborate, lithium fluoroborate, acidic potassium fluoride, acidic sodium fluoride, acidic lithium fluoride, potassium fluoride, sodium fluoride, and lithium fluoride.

Among those, from the viewpoint of heat resistance at a time of sintering the electrode material (a property that the flux is not volatilized at a low sintering temperature) and complementing the oxidation resistance of the copper-containing particles, particularly preferable examples of the flux include potassium borate and potassium fluoroborate.

In the present invention, these fluxes can be respectively used singly or in combination of two or more kinds thereof.

Furthermore, the content of the flux in the paste composition for an electrode according to the present invention is preferably from 0.1 to 5% by mass, more preferably from 0.3 to 4% by mass, even more preferably from 0.5 to 3.5% by mass, particularly preferably from 0.7 to 3% by mass, and extremely preferably from 1 to 2.5% by mass, based on the total mass of the paste composition for an electrode, from the viewpoint of effectively exhibiting the oxidation resistance of the copper-containing particles and from the viewpoint of reducing the porosity of a portion from which the flux is removed at a time of completion of the sintering of the electrode material.

(Other Components)

Furthermore, the paste composition for an electrode according to the present invention can include, in addition to the above-described components, other components generally used in the art, if necessary. Examples of other components include a plasticizer, a dispersant, a surfactant, an inorganic binder, a metal oxide, a ceramic, and an organic metal compound.

The method for preparing the paste composition for an electrode according to the present invention is not particularly limited. The paste composition for an electrode according to the present invention can be prepared by dispersing and mixing copper-containing particles, glass particles, a solvent, a resin, silver particles to be added, if necessary, and the like, using a method that is typically used for dispersing and mixing.

<Method for Preparing Electrode Using Paste Composition for Electrode>

As for the method for preparing an electrode using the paste composition for an electrode according to the present invention, the paste composition for an electrode can be provided in a region in which the electrode is formed, dried, and then sintered to form the electrode in a desired region. By using the paste composition for an electrode, an electrode having a low resistivity can be formed even with a sintering treatment in the presence of oxygen (for example, in the atmosphere).

Specifically, for example, when an electrode for a photovoltaic cell is formed using the paste composition for an electrode, the paste composition for an electrode can be provided to a silicon substrate to a desired shape, dried, and then sintered to form an electrode for a photovoltaic cell having a low resistivity in a desired shape. Further, by using the paste composition for an electrode, an electrode having a low resistivity can be formed even with a sintering treatment in the presence of oxygen (for example, in the atmosphere).

Examples of the method for providing the paste composition for an electrode on a silicon substrate include screen printing, an ink-jet method, and a dispenser method, but from the viewpoint of the productivity, application by screen printing is preferred.

When the paste composition for an electrode according to the present invention is applied by screen printing, it is preferable that the viscosity be in the range from 80 to 1000 Pa·s. Further, the viscosity of the paste composition for an electrode is measured using a Brookfield HBT viscometer at 25° C.

The amount of the paste composition for an electrode to be provided can be appropriately selected according to the size of the electrode formed. For example, the amount of the paste composition for an electrode to be provided can be from 2 to 10 g/m², and preferably from 4 to 8 g/m².

Moreover, as a heat treatment condition (sintering condition) when forming an electrode using the paste composition for an electrode according to the present invention, heat treatment conditions generally used in the art can be applied.

Generally, the heat treatment temperature (sintering temperature) is from 800 to 900° C., but when using the paste composition for an electrode according to the present invention, a heat treatment condition at a lower temperature can be applied, and for example, an electrode having excellent characteristics can be formed at a heat treatment temperature of from 600 to 850° C.

In addition, the heat treatment time can be appropriately selected according to the heat treatment temperature and the like, and it may be, for example, 1 second to 20 seconds.

<Photovoltaic Cell>

The photovoltaic cell of the present invention has an electrode formed by sintering the paste composition for an electrode provided to the silicon substrate. As a result, a photovoltaic cell having excellent characteristics can be obtained, and the productivity of the photovoltaic cell is excellent.

Hereinbelow, specific examples of the photovoltaic cell of the present invention will be described with reference to the drawings, but the present invention is not limited thereto.

Figure 2:
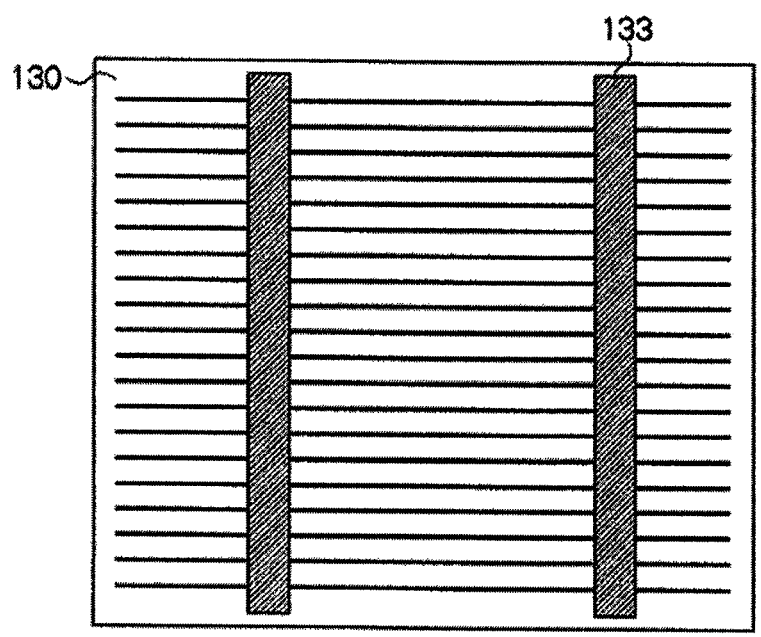
FIG. 2 is a plane view showing the light-receiving surface side of the photovoltaic cell according to the present invention.
Figure 3:
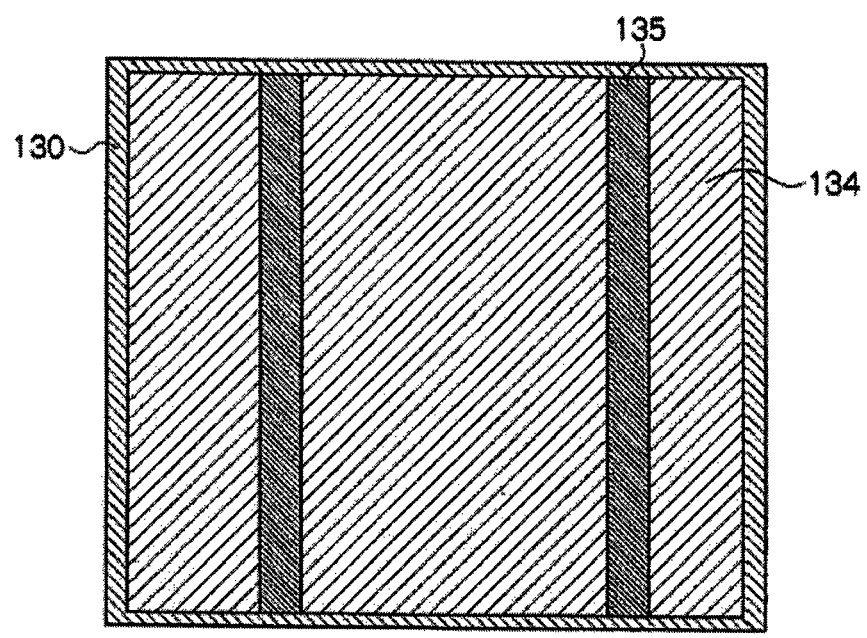
FIG. 3 is a plane view showing the back surface side of the photovoltaic cell according to the present invention.

A cross-sectional view, and schematic views of the light-receiving surface and the back surface of one example of the representative photovoltaic cell elements are shown in FIGS. 1, 2, and 3, respectively.

Typically, monocrystalline or polycrystalline Si, or the like is used in a semiconductor substrate 130 of a photovoltaic cell element. This semiconductor substrate 130 contains boron and the like, and constitutes a p-type semiconductor. Unevenness (texture, not shown) is formed on the light-receiving surface side by etching so as to inhibit the reflection of sunlight. Phosphorous and the like are doped on the light-receiving surface side, a diffusion layer 131 of an n-type semiconductor with a thickness on the order of submicrons is provided, and a p/n junction is formed on the boundary with the p-type bulk portion. Also, on the light-receiving surface side, an anti-reflection layer 132 such as silicon nitride with a film thickness of around 100 nm is provided on the diffusion layer 131 by a vapor deposition method or the like.

Next, a light-receiving surface electrode 133 provided on the light-receiving surface side, a current collection electrode 134 formed on the back surface, and an output extraction electrode 135 will be described. The light-receiving surface electrode 133 and the output extraction electrode 135 are formed from the paste composition for an electrode. Further, the current collection electrode 134 is formed from the aluminum electrode paste composition including glass powders. These electrodes are formed by applying the paste composition for a desired pattern by screen printing or the like, drying, and then sintering at about from 600° C. to 850° C. in an atmosphere.

In the present invention, an electrode having low resistivity and low contact resistivity can be formed even with sintering at a relatively low temperature, by using the paste composition for an electrode is formed.

Here, on the light-receiving surface side, the glass particles included in the paste composition for an electrode forming the light-receiving surface electrode 133 undergo a reaction with the anti-reflection layer 132 (fire-through), thereby electrically connecting (ohmic contact) the light-receiving surface electrode 133 and the diffusion layer 131.

In the present invention, due to using the paste composition for an electrode to form the light-receiving surface electrode 133 including copper as a conductive metal, the oxidation of copper is inhibited, whereby the light-receiving surface electrode 133 having a low resistivity is formed with high productivity.

Further, on the back surface side, upon sintering, aluminum which is included in the aluminum electrode paste composition for forming the current collection electrode 134 is diffused on and into the back surface of the semiconductor substrate 130 to form an electrode component diffusion layer 136, and as a result, ohmic contact is formed among the semiconductor substrate 130, the current collection electrode 134, and the output extraction electrode 135.

Figure 4A:
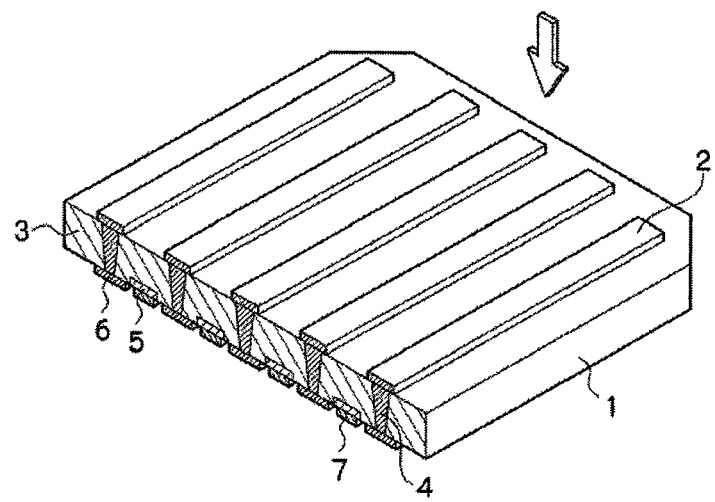
FIG. 4A is a perspective view showing the AA cross-sectional constitution of the cell back contact-type photovoltaic cell according to the present invention.
Figure 4B:
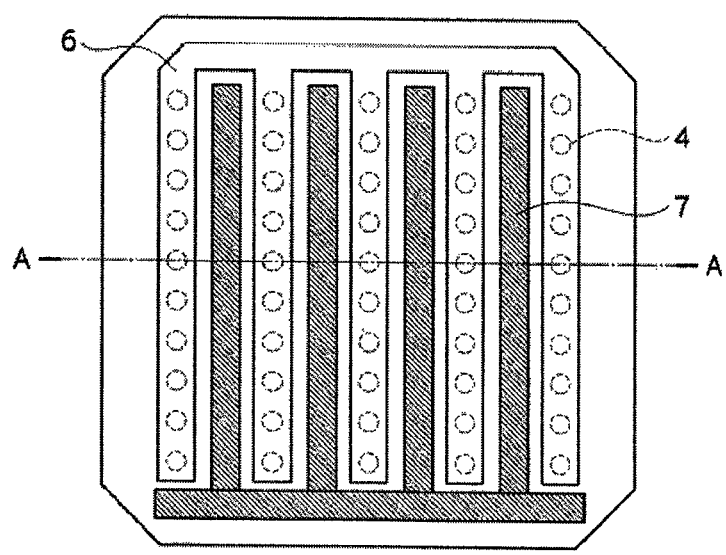
FIG. 4B is a plane view showing the back surface side electrode structure of the cell back contact-type photovoltaic cell according to the present invention.

In FIGS. 4A and 4B, the perspective view FIG. 4A of the light-receiving surface and the AA cross-section structure, and the plane view FIG. 4B of the back surface side electrode structure in one example of the photovoltaic cell element are shown as another embodiment according to the present invention.

As shown in FIGS. 4A and 4B, in a cell wafer 1 including a silicon substrate of a p-type semiconductor, a through-hole passes through both sides of the light-receiving surface side and the back surface side is formed by laser drilling, etching, or the like. Further, a texture (not shown) for improving the efficiency of incident light is formed on the light-receiving surface side. Also, the light-receiving surface side has an n-type semiconductor layer 3 formed by n-type diffusion treatment, and an anti-reflection film (not shown) formed on the n-type semiconductor layer 3. These are prepared by the same process for a conventional crystal Si-type photovoltaic cell.

Next, the paste composition for an electrode according to the present invention is filled in the inside of the through-hole previously formed by a printing method or an ink-jet method, and also, the paste composition for an electrode according to the present invention is similarly printed in the grid shape on the light-receiving surface side, thereby forming a composition layer which forms the through-hole electrode 4 and the grid electrode 2 for current collection.

Here, regarding the paste used for filling and printing, although it is preferable to use the most suitable paste for each process from the point of view of properties such as viscosity, one paste of the same composition may be used for filling or printing at the same time.

On the other hand, a high-concentration doped layer 5 is formed on the opposite side of the light-receiving surface (back surface side) so as to prevent the carrier recombination. Here, as an impurity element forming the high-concentration doped layer 5, boron (B) or aluminum (Al) is used, and a $p^+$ layer is formed. This high-concentration doped layer 5 may be formed by carrying out a thermal diffusion treatment using, for example, B as a diffusion source in the step of preparing a cell before forming the anti-reflection film, or when using Al, it may also be formed by printing an Al paste on the opposite surface side in the printing step.

Thereafter, the paste composition for an electrode is printed on the side of an anti-reflection film and is also filled in the inside of the through-hole, which is formed on the light-receiving surface side, and then is sintered at 650 to 850° C., whereby the paste composition can attain ohmic contact with the n-type layer as an under layer by a fire-through effect.

Furthermore, as shown in the plane view of FIG. 4B, the paste composition for an electrode according to the present invention is printed in stripe shapes on each of the n side and the p side, and sintered, and thus, the back surface electrodes 6 and 7 are formed on the opposite surface side.

In the present invention, the through-hole electrode 4, the grid electrode 2 for current collection, the back surface electrode 6, and the back surface electrode 7 are formed using the paste composition for an electrode, and thus, the through-hole electrode 4, the grid electrode 2 for current collection, the back surface electrode 6, and the back surface electrode 7, each of which includes copper as a conductive metal, inhibits the oxidation of copper, and has a low resistivity, are formed with high productivity.

Moreover, the paste composition for an electrode according to the present invention is not restricted to the applications of the above-described photovoltaic cell electrodes, and can also be appropriately used in applications such as, for example, electrode wirings and shield wirings of plasma displays, ceramic condensers, antenna circuits, various sensor circuits, and heat dissipation materials of semiconductor devices.

EXAMPLES

Hereinbelow, the present invention will be described in detail with reference to Examples, but the present invention is not limited to these Examples. Further, unless otherwise specified, "parts" and "%" are based on mass.

Example 1

(a) Preparation of Paste Composition for Electrode

A phosphorous-containing copper alloy containing 1% by mass of phosphorous was prepared, dissolved, made into a powder by a water atomization method, then dried, and classified. The classified powders were blended and subjected to deoxidation/dehydration treatments to prepare phosphorous-containing copper alloy particles containing 1% by mass of phosphorous. Further, the particle diameter (D50%) of the phosphorous-containing copper alloy particle was 1.5 µm.

Further, the simultaneous ThermoGravimetry/Differential Thermal Analysis (TG-DTA) was carried out in a normal atmosphere using a measurement apparatus: a Thermo-Gravimetry/Differential Thermal Analysis analyzer (TG/DTA-6200 type, manufactured by SII Nano Technology Inc.), under the conditions of a measurement temperature range: room temperature to 1000° C., a temperature increase rate: 40° C./min., and an atmospheric air flow rate: 200 ml/min. As a result, it was found that a peak temperature of an exothermic peak showing a maximum area in the simultaneous Thermo-Gravimetry/Differential Thermal Analysis (TG-DTA) was 292° C.

Glass including 32 parts of vanadium oxide ($V_2O_5$), 26 parts of phosphorous oxide ($P_2O_5$), 10 parts of barium oxide (BaO), 10 parts of tungsten oxide ($WO_3$), 1 part of sodium oxide ($Na_2O$), 3 parts of potassium oxide ($K_2O$), 10 parts of zinc oxide (ZnO), and 8 parts of manganese oxide (MnO) (hereinafter abbreviated as "G19" in some cases) was prepared. This glass G19 had a softening point of 447° C. and a crystallization temperature of higher than 600° C.

By using the glass G19 obtained, glass particles having a particle diameter (D50%) of 1.7 µm were obtained.

39.2 parts of the phosphorous-containing copper alloy particles obtained above, 45.9 parts of silver particles (particle diameter (D50%) 3 µm, a high-purity chemical product manufactured by Sigma-Aldrich Corporation), 1.7 parts of glass particles, and 13.2 parts of a butyl carbitol acetate (BCA) solution including 4% of ethyl cellulose (EC) were mixed and stirred in a mortar made of agate for 20 minutes, thereby preparing a paste composition 1 for an electrode.

(b) Preparation of Photovoltaic Cell

A p-type semiconductor substrate having a film thickness of 190 µm, in which an n-type semiconductor layer, a texture, and an anti-reflection film (silicon nitride film) were formed on the light-receiving surface, was prepared, and cut to a size of 125 mm×125 mm. The paste composition 1 for an electrode obtained above was printed on the light-receiving surface for an electrode pattern as shown in FIG. 2, using a screen printing method. The pattern of the electrode was constituted with finger lines with a 150 µm width and bus bars with a 1.1 mm width, and the printing conditions (a mesh of a screen plate, a printing speed, a printing pressure) were appropriately adjusted so as to give a film thickness after sintering of 20 µm. The resultant was put into an oven heated at 150° C. for 15 minutes, and the solvent was removed by evaporation.

Subsequently, an aluminum electrode paste was similarly printed on the entire surface of the back surface by screen printing. The printing conditions were appropriately adjusted so as to give a film thickness after sintering of 40 µm. The resultant was put into an oven, heated at 150° C. for 15 minutes, and the solvent was removed by evaporation.

Then, a heating treatment (sintering) was carried out at 850° C. for 2 seconds under an air atmosphere in an infrared rapid heating furnace to prepare a cell 1 of a photovoltaic cell having a desired electrode formed therein.

Example 2

In the same manner as in Example 1, except that the temperature for heating treatment (sintering) during formation of an electrode was changed from 850° C. to 750° C. in Example 1, a cell 2 of a photovoltaic cell having a desired electrode formed therein was prepared.

Examples 3 to 15 and Examples 43 to 46

In the same manner as in Example 1, except that the content, the particle diameter (D50%), and the content of phosphorous in the phosphorous-containing copper alloy particles, the particle diameter (D50%) and the content of the silver particles, the type and the content of the glass particle, the content of the butyl carbitol acetate (BCA) solution including 4% of ethyl cellulose (EC), and the type and the content of the phosphorous-containing compound, which was contained, if necessary, were changed as shown in Table 1 in Example 1, paste compositions 3 to 15 for electrodes and paste compositions 43 to 46 for electrodes were prepared.

Further, the glass particles (AY1) included 45 parts of vanadium oxide ($V_2O_5$), 24.2 parts of phosphorous oxide ($P_2O_5$), 20.8 parts of barium oxide (BaO), 5 parts of antimony oxide ($Sb_2O_3$), and 5 parts of tungsten oxide ($WO_3$), and had a particle diameter (D50%) of 1.7 μm. Further, the glass had a softening point of 492° C. and a crystallization temperature of higher than 600° C.

In addition, the glass particles (D10) included 64 parts of lead oxide (PbO), 11 parts of boron oxide ($B_2O_3$), 5 parts of aluminum oxide ($Al_2O_3$), 10 parts of silicon dioxide ($SiO_2$), and 10 parts of zinc oxide (ZnO), and had a particle diameter (D50%) of 2.3 μm. Further, the glass had a softening point of 440° C. and a crystallization temperature of higher than 600° C.

Also, triphenyl phosphate was used as the phosphoric ester, and hexaphenoxyphosphazene was used as the cyclic phosphazene.

Then, in the same manner as in Example 1, except that the temperature for heating treatment and the treatment time were changed as shown in Table 1, using the paste compositions 3 to 15 for electrodes and paste compositions 43 to 46 for electrodes obtained above, cells 3 to 15 of photovoltaic cells and cells 43 to 46 of photovoltaic cells, each having a desired electrode formed therein, were prepared, respectively.

Comparative Example 1

In the same manner as in Example 1, except that the phosphorous-containing copper alloy particles were not used in the preparation of the paste composition for an electrode and the respective components were changed to the compositions shown in Table 1 in Example 1, a paste composition C1 for an electrode was prepared.

In the same manner as in Example 1, except that the paste composition C1 for an electrode not including the phosphorous-containing copper alloy particles was used, a cell C1 of a photovoltaic cell was prepared.

Comparative Example 2

In the same manner as in Comparative Example 1, except that the temperature for heating treatment (sintering) during formation of an electrode was changed from 850° C. to 750° C. in Comparative Example 1, a cell C2 of a photovoltaic cell was prepared.

Comparative Example 3

In the same manner as in Example 1, except that pure copper not containing phosphorous (the content of phosphorous was 0%) was used instead in Example 1, a paste composition C3 for an electrode was prepared.

In the same manner as in Example 1, except that the paste composition C3 for an electrode was used, a cell C3 of a photovoltaic cell was prepared.

TABLE 1

| | Phosphorous-containing copper alloy particle | | | | Silver particles | | Glass particles | | 4% EC-containing BCA solution | Phosphorous-containing compound | | Treatment temperature/ Treatment time |
|---|---|---|---|---|---|---|---|---|---|---|---|---|
| Example | Content (parts) | Content of phosphorous (at. %) | Particle diameter (D 50%) (μm) | TG-DTA peak temperature (° C.) | Content (parts) | Particle diameter (D 50%) (μm) | Content (parts) | Type | Content (parts) | Content (parts) | Type | |
| Example 1 | 39.2 | 1 | 1.5 | 292 | 45.9 | 3 | 1.7 | G19 | 13.2 | 0 | — | 850° C./ 2 seconds |
| Example 2 | 39.2 | 1 | 1.5 | 292 | 45.9 | 3 | 1.7 | G19 | 13.2 | 0 | — | 750° C./ 10 seconds |
| Example 3 | 39.2 | 1 | 1.5 | 292 | 45.9 | 1 | 1.7 | G19 | 13.2 | 0 | — | 850° C./ 2 seconds |
| Example 4 | 39.2 | 1 | 1.5 | 292 | 45.9 | 3 | 1.7 | G19 | 10.2 | 3 | Phosphoric ester | 850° C./ 2 seconds |
| Example 5 | 39.2 | 1 | 1.1 | 292 | 45.9 | 3 | 1.7 | G19 | 13.2 | 0 | — | 850° C./ 2 seconds |
| Example 6 | 39.2 | 1 | 1.1 | 292 | 45.9 | 3 | 1.7 | G19 | 13.2 | 0 | — | 850° C./ 2 seconds |
| Example 7 | 39.2 | 2 | 1.5 | 314 | 45.9 | 3 | 1.7 | G19 | 13.2 | 0 | — | 850° C./ 2 seconds |
| Example 8 | 39.2 | 2 | 1.5 | 314 | 45.9 | 3 | 1.7 | G19 | 13.2 | 0 | — | 750° C./ 10 seconds |
| Example 9 | 39.2 | 2 | 1.5 | 314 | 45.9 | 3 | 1.7 | AY1 | 13.2 | 0 | — | 750° C./ 10 seconds |
| Example 10 | 39.2 | 8 | 1.5 | 358 | 45.9 | 3 | 1.7 | AY1 | 13.2 | 0 | — | 650° C./ 10 seconds |
| Example 11 | 54.8 | 2 | 1.5 | 314 | 30.3 | 3 | 1.7 | AY1 | 13.2 | 0 | — | 750° C./ 20 seconds |
| Example 12 | 54.8 | 2 | 1.5 | 314 | 30.3 | 3 | 1.7 | AY1 | 10.2 | 3 | Cyclic phosphazene | 750° C./ 20 seconds |
| Example 13 | 75.1 | 8 | 1.1 | 358 | 10.0 | 3 | 1.7 | AY1 | 13.2 | 0 | — | 750° C./ 20 seconds |
| Example 14 | 38.4 | 1 | 1.5 | 292 | 45.0 | 3 | 3.4 | G19 | 13.2 | 0 | — | 850° C./ 2 seconds |
| Example 15 | 35.0 | 1 | 1.5 | 292 | 41.6 | 3 | 3.4 | G19 | 20.0 | 0 | — | 850° C./ 2 seconds |

TABLE 1-continued

| | Phosphorous-containing copper alloy particle | | | | Silver particles | | Glass particles | | 4% EC-containing BCA solution (parts) | Phosphorous- containing compound | | Treatment temperature/ Treatment time |
|---|---|---|---|---|---|---|---|---|---|---|---|---|
| Example | Content (parts) | Content of phosphorous (at. %) | Particle diameter (D 50%) (μm) | TG-DTA peak temperature (° C.) | Content (parts) | Particle diameter (D 50%) (μm) | Content (parts) | Type | | Content (parts) | Type | |
| Comparative Example 1 | — | — | — | — | 85.1 | 3 | 1.7 | G19 | 13.2 | 0 | — | 850° C./ 2 seconds |
| Comparative Example 2 | — | — | — | — | 85.1 | 3 | 1.7 | G19 | 13.2 | 0 | — | 750° C./ 10 seconds |
| Comparative Example 3 | 49.2 | 0 | 1.5 | 230 | 1.0 | 3 | 1.7 | G19 | 13.2 | 0 | — | 850° C./ 2 seconds |

<Evaluation>

The photovoltaic cells prepared were evaluated with a combination of WXS-155 S-10 manufactured by Wacom-Electric Co., Ltd. as artificial sunlight and a measurement device of I-V CURVE TRACER MP-160 (manufactured by EKO INSTRUMENT CO., LTD.) as a current-voltage (I-V) evaluation and measurement device. Eff (conversion efficiency), FF (fill factor), Voc (open voltage), and Jsc (short circuit current) indicating the power generation performances as a photovoltaic cell were obtained by carrying out the measurement in accordance with each of JIS-C-8912, JIS-C-8913, and JIS-C-8914. The respective measured values are shown in Table 2 in terms of a relative value when the value measured in Comparative Example 1 was taken as 100.0.

Furthermore, in Comparative Example 3, the resistivity of the electrode by oxidation of the copper particles increased, and thus, could not be evaluated.

electrodes formed while not using the silver particles, nevertheless exhibited high power generation performances.

Further, the diffractive X-ray of the light-receiving surface electrode was measured by an X-ray diffraction method using a CuKα ray, and as a result, diffraction peaks specific to copper were shown at the diffraction angles (2θ, CuKα ray) of at least 43.4°, 50.6°, and 74.2°. As such, as a reason why copper was detected from the light-receiving surface electrode, the following principles can be mentioned. First, the phosphorous-containing copper alloy particles in the paste compositions 44 to 46 for electrodes had a content of phosphorous of 7% by mass. This composition includes a Cu phase and a $Cu_3P$ phase as seen from a Cu—P-based phase diagram. At an initial state in the sintering, the Cu phase is oxidized to CuO. It is thought that this CuO reacts with $Cu_3P$ to produce a Cu phase.

TABLE 2

| | | Power generation performance as solar cell | | | |
|---|---|---|---|---|---|
| Example | Treatment temperature/ Treatment time | Eff (relative value) Conversion efficiency | FF (relative value) Fill factor | Voc (relative value) Open voltage | Jsc (relative value) Short circuit current |
| Example 1 | 850° C./2 seconds | 101 | 102 | 98.3 | 102.2 |
| Example 2 | 750° C./10 seconds | 85.4 | 93.2 | 92.2 | 94.2 |
| Example 3 | 850° C./2 seconds | 98.2 | 96.2 | 98 | 100 |
| Example 4 | 850° C./2 seconds | 100 | 101 | 98.5 | 103 |
| Example 5 | 850° C./2 seconds | 103 | 104 | 99.3 | 104.2 |
| Example 6 | 850° C./2 seconds | 102 | 103.5 | 99 | 103.4 |
| Example 7 | 850° C./2 seconds | 104 | 109 | 98.3 | 109.2 |
| Example 8 | 750° C./10 seconds | 90.1 | 95.3 | 97.1 | 97 |
| Example 9 | 750° C./10 seconds | 92.1 | 95.9 | 97.1 | 99.2 |
| Example 10 | 650° C./10 seconds | 100.2 | 101 | 98.3 | 100.9 |
| Example 11 | 750° C./10 seconds | 100.9 | 102.1 | 98.9 | 101.1 |
| Example 12 | 750° C./20 seconds | 100.1 | 99.1 | 98.1 | 100 |
| Example 13 | 750° C./20 seconds | 100.1 | 99.1 | 98.1 | 100 |
| Example 14 | 850° C./2 seconds | 101 | 102 | 98.3 | 102.2 |
| Example 15 | 850° C./2 seconds | 102 | 104 | 99.7 | 105 |
| Example 43 | 850° C./2 seconds | 101.9 | 103.7 | 99.9 | 104.5 |
| Example 44 | 850° C./2 seconds | 92.3 | 96.3 | 98 | 94.5 |
| Example 45 | 850° C./2 seconds | 100.6 | 101.3 | 100.8 | 97.7 |
| Example 46 | 850° C./2 seconds | 102.8 | 100.9 | 99.9 | 103.9 |
| Comparative Example 1 | 850° C./2 seconds | 100 | 100 | 100 | 100 |
| Comparative Example 2 | 750° C./10 seconds | 65.6 | 82.4 | 82.4 | 82.4 |
| Comparative Example 3 | 850° C./2 seconds | — | — | — | — |

The performances of the photovoltaic cells prepared in Examples 1 to 15 and Examples 43 to 46 were substantially equivalent to the values measured in Comparative Example 1. In particular, in the cells 44 to 46 of photovoltaic cells, the Among the phosphorous-containing copper alloy particles obtained, the phosphorous-containing copper particles having a content of phosphorous of 7% by mass and a particle diameter (D50%) of 5.0 μm were subjected to simultaneous ThermoGravimetry/Differential Thermal Analysis (TG-DTA), using a ThermoGravimetry/Differential Thermal Analysis analyzer (TG/DTA-6200 type, manufactured by SII Nano Technology Inc.) in a normal atmosphere under the conditions of a measurement temperature range: room temperature to 1000° C., a temperature increase rate: 40° C./min., and an atmospheric air flow rate: 200 ml/min. The results are shown in FIG. 5.

Figure 5:
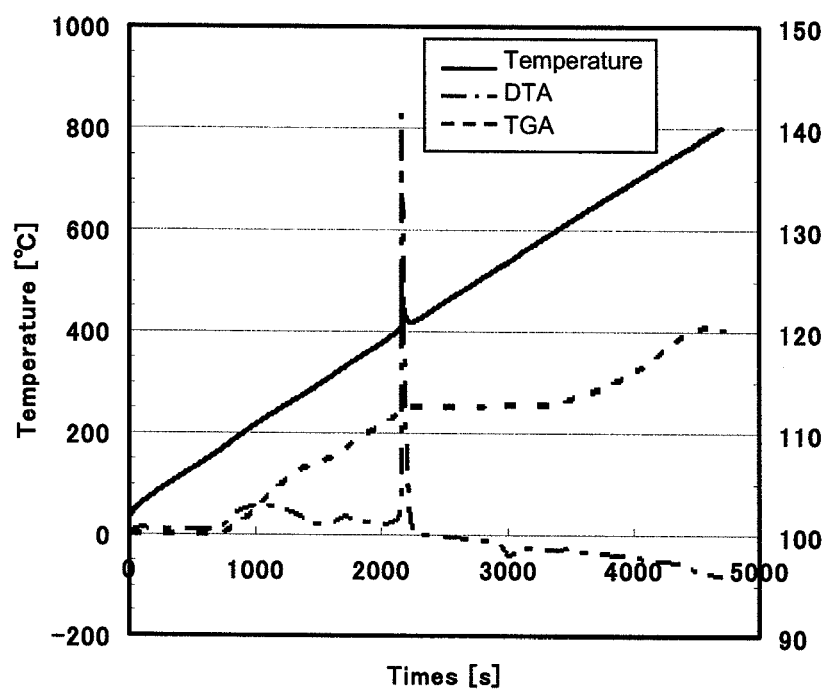
FIG. 5 is a chart showing an example of the simultaneous ThermoGravimetry/Differential Thermal Analysis (TG-DTA) of the phosphorous-containing copper alloy particles according to the present invention.

From FIG. 5, it can be seen that these phosphorous-containing copper alloy particles had a peak temperature in the exothermic peak showing a maximum area of 420° C.

Example 16

By using the paste composition 1 for an electrode obtained above, a cell 16 of a photovoltaic cell having the structure as shown in FIG. 4A was prepared. Further, the heating treatment was carried out at 750° C. for 10 seconds.

The cell of a photovoltaic cell obtained was evaluated in the above-described manner, and found to exhibit excellent characteristics as above.

Example 17

(a) Preparation of Paste Composition for Electrode 85.1 parts of the silver-coated copper particles (manufactured by Hitachi Chemical Co., Ltd., silver coating amount 20% by mass, particle diameter 5.8 μm) prepared by the method described in JP-A No. 14-100191, 1.7 parts of glass particles, and 13.2 parts of a butyl carbitol acetate (BCA) solution including 4% of ethyl cellulose (EC) were mixed and stirred in a mortar made of agate for 20 minutes, thereby preparing a paste composition 17 for an electrode.

(b) Preparation of Photovoltaic Cell

A p-type semiconductor substrate having a film thickness of 190 μm, in which an n-type semiconductor layer, a texture, and an anti-reflection film (silicon nitride film) were formed on the light-receiving surface, was prepared, and cut to a size of 125 mm×125 mm. The paste composition 17 for an electrode obtained above was printed on the light-receiving surface for an electrode pattern as shown in FIG. 2, using a screen printing method. The pattern of the electrode was constituted with finger lines with a 150 μm width and bus bars with a 1.1 mm width, and the printing conditions (a mesh of a screen plate, a printing speed, a printing pressure) were appropriately adjusted so as to give a film thickness after sintering of 20 μm. The resultant was put into an oven heated at 150° C. for 15 minutes, and the solvent was removed by evaporation.

Subsequently, an aluminum electrode paste was similarly printed on the entire surface of the back surface by screen printing. The printing conditions were appropriately adjusted so as to give a film thickness after sintering of 40 μm. The resultant was put into an oven heated at 150° C. for 15 minutes, and the solvent was removed by evaporation.

Then, a heating treatment (sintering) was carried out at 850° C. for 2 seconds under an air atmosphere in an infrared rapid heating furnace to prepare a cell 17 of a photovoltaic cell having a desired electrode formed therein.

Examples 18 to 25

In the same manner as in Example 17, except that the silver coating amount and the content of the silver-coated copper particles, the particle diameter (D50%) and the content of the silver particles which were used, if necessary, and the type and the content of the glass particles, and the content of the butyl carbitol acetate (BCA) solution including 4% of ethyl cellulose (EC) were changed as shown in Table 3 in Example 17, paste compositions 18 to 25 for an electrode were prepared.

Further, as the silver particles, a high-purity chemical product manufactured by Sigma-Aldrich Corporation, having a particle diameter (D50%) of 1 μm or 3 μm was used.

Then, in the same manner as in Example 17, except that the temperature for heating treatment and the treatment time were changed as shown in Table 3, using the paste compositions 18 to 25 for an electrode obtained, cells 18 to 25 of photovoltaic cells, each having a desired electrode formed therein, were prepared, respectively.

Comparative Example 4

In the same manner as in Example 17, except that the silver-coated copper particles were not used in the preparation of the paste composition for an electrode and the respective components were changed to the compositions shown in Table 3 in Example 17, a paste composition C4 for an electrode was prepared.

In the same manner as in Example 17, except that the paste composition C4 for an electrode not including the silver-coated copper particles was used, a cell C4 of a photovoltaic cell was prepared.

Comparative Example 5

In the same manner as in Comparative Example 4, except that the temperature of heating treatment (sintering) at a time of forming an electrode was changed from 850° C. to 750° C. in Comparative Example 4, a cell C5 of a photovoltaic cell was prepared.

Comparative Example 6

In the same manner as in Example 17, except that the silver-coated copper particles were not used in the preparation of the paste composition for an electrode and the respective components were changed to the compositions shown in Table 3 in Example 17, a paste composition C6 for an electrode was prepared.

In the same manner as in Example 17, except that the paste composition C6 for an electrode was used, a cell C6 of a photovoltaic cell was prepared.

TABLE 3

| Example | Silver-coated copper particles | | | | Silver particles | | Glass particles | | 4% EC-containing BCA solution (parts) | Treatment temperature/ Treatment time |
|---|---|---|---|---|---|---|---|---|---|---|
| | Content (parts) | Silver coating amount (%) | Particle diameter (D 50%) (μm) | TG-DTA peak temperature (° C.) | Content (parts) | Particle diameter (D 50%) (mm) | Content (parts) | Type | | |
| Example 17 | 85.1 | 20 | 5 | 600 | 0 | 1 | 1.7 | G19 | 13.2 | 850° C./2 seconds |
| Example 18 | 39.2 | 20 | 5 | 600 | 45.9 | 1 | 1.7 | G19 | 13.2 | 850° C./2 seconds |
| Example 19 | 39.2 | 20 | 5 | 600 | 45.9 | 1 | 1.7 | G19 | 13.2 | 750° C./10 seconds |
| Example 20 | 85.1 | 25 | 5 | 620 | 0 | 1 | 1.7 | G19 | 13.2 | 850° C./2 seconds |
| Example 21 | 39.2 | 25 | 5 | 620 | 45.9 | 1 | 1.7 | G19 | 13.2 | 850° C./2 seconds |
| Example 22 | 39.2 | 25 | 5 | 620 | 45.9 | 1 | 1.7 | G19 | 13.2 | 750° C./10 seconds |
| Example 23 | 85.1 | 30 | 5 | 640 | 0 | 1 | 1.7 | G19 | 13.2 | 850° C./2 seconds |
| Example 24 | 39.2 | 30 | 5 | 640 | 45.9 | 1 | 1.7 | G19 | 13.2 | 850° C./2 seconds |
| Example 25 | 39.2 | 30 | 5 | 640 | 45.9 | 1 | 1.7 | G19 | 13.2 | 750° C./10 seconds |
| Comparative Example 4 | — | — | — | — | 85.1 | 3 | 1.7 | G19 | 13.2 | 850° C./2 seconds |
| Comparative Example 5 | — | — | — | — | 85.1 | 3 | 1.7 | G19 | 13.2 | 750° C./10 seconds |
| Comparative Example 6 | 49 | 0 | 1.5 | 230 | 1.2 | 3 | 1.7 | G19 | 13.2 | 850° C./2 seconds |

<Evaluation>

The photovoltaic cells prepared were evaluated with a combination of WXS-155 S-10 manufactured by Wacom-Electric Co., Ltd. as artificial sunlight and a measurement device of I-V CURVE TRACER MP-160 (manufactured by EKO INSTRUMENT CO., LTD.) as a current-voltage (I-V) evaluation and measurement device. Eff (conversion efficiency), FF (fill factor), Voc (open voltage), and Jsc (short circuit current) indicating the power generation performances as a photovoltaic cell were obtained by carrying out the measurement in accordance with each of JIS-C-8912, JIS-C-8913, and JIS-C-8914. The respective measured values are shown in Table 4 in terms of a relative value when the value measured in Comparative Example 4 was taken as 100.0.

Furthermore, in Comparative Example 6, the resistivity of the electrode by oxidation of the copper particles increased, and thus, could not be evaluated.

TABLE 4

| | | Power generation performance as solar cell | | | |
|---|---|---|---|---|---|
| Example | Treatment temperature/ Treatment time | Eff (relative value) Conversion efficiency | FF (relative value) Fill factor | Voc (relative value) Open voltage | Jsc (relative value) Short circuit current |
| Example 17 | 850° C./2 seconds | 100.1 | 101 | 98.6 | 103.1 |
| Example 18 | 850° C./2 seconds | 101.2 | 102.1 | 98.4 | 103 |
| Example 19 | 750° C./10 seconds | 85.6 | 92.2 | 92.5 | 94.2 |
| Example 20 | 850° C./2 seconds | 100 | 100.5 | 98.6 | 102 |
| Example 21 | 850° C./2 seconds | 103.3 | 102.1 | 99.3 | 104.3 |
| Example 22 | 750° C./10 seconds | 90.3 | 95.4 | 97.2 | 97.1 |
| Example 23 | 850° C./2 seconds | 101.1 | 101.9 | 98.7 | 100.1 |
| Example 24 | 850° C./2 seconds | 103.1 | 105.4 | 98.1 | 107.2 |
| Example 25 | 750° C./10 seconds | 90.2 | 95.4 | 97.5 | 97.1 |
| Comparative Example 4 | 850° C./2 seconds | 100 | 100 | 100 | 100 |
| Comparative Example 5 | 750° C./10 seconds | 65.6 | 82.4 | 82.4 | 82.4 |
| Comparative Example 6 | 850° C./2 seconds | — | — | — | — |

Example 26

By using the paste composition 19 for an electrode obtained above, a cell 26 of a photovoltaic cell having the structure as shown in FIG. 4A was prepared. Further, the heating treatment was carried out at 750° C. for 10 seconds.

The cell of a photovoltaic cell obtained was evaluated in the above-described manner, and found to exhibit excellent characteristics as above.

Example 27

(a) Preparation of Paste Composition for Electrode

Benzotriazole (BTA) as a surface treatment agent was dissolved in ethanol as a solvent to prepare a 50% surface treatment solution. Copper powders (manufactured by Fukuda Metal Foil & Powder Co., Ltd., purity 99.9%, particle diameter 5 μm) were immersed therein for 50 minutes, and then dried to prepare surface-treated copper particles. The content of the surface treatment agent in the surface-treated copper particles was 1% based on the total mass of the surface-treated copper particles. Further, the particle diameter (D50%) was 5 μm.

39.2 parts of the surface-treated copper particles obtained above, 45.9 parts of the silver particles (particle diameter (D50%) 3 μm, a high-purity chemical product manufactured by Sigma-Aldrich Corporation), 1.7 parts of glass particle, and 13.2 parts of a butyl carbitol acetate (BCA) solution including 4% of ethyl cellulose (EC) were mixed and stirred in a mortar made of agate for 20 minutes, thereby preparing a paste composition 27 for an electrode.

(b) Preparation of Photovoltaic Cell

A p-type semiconductor substrate having a film thickness of 190 μm, in which an n-type semiconductor layer, a texture, and an anti-reflection film (silicon nitride film) were formed on the light-receiving surface, was prepared, and cut to a size of 125 mm×125 mm. The paste composition 27 for an electrode obtained above was printed on the light-receiving surface for an electrode pattern as shown in FIG. 2, using a screen printing method. The pattern of the electrode was constituted with finger lines with a 150 μm width and bus bars with a 1.1 mm width, and the printing conditions (a mesh of a screen plate, a printing speed, a printing pressure) were appropriately adjusted so as to give a film thickness after sintering of 20 μm. The resultant was put into an oven heated at 150° C. for 15 minutes, and the solvent was removed by evaporation.

Subsequently, an aluminum electrode paste was similarly printed on the entire surface of the back surface by screen printing. The printing conditions were appropriately adjusted so as to give a film thickness after sintering of 40 μm. The resultant was put into an oven heated at 150° C. for 15 minutes, and the solvent was removed by evaporation.

Then, a heating treatment (sintering) was carried out at 850° C. for 2 seconds under an air atmosphere in an infrared rapid heating furnace to prepare a cell 27 of a photovoltaic cell having a desired electrode formed therein.

Examples 28 to 41

In the same manner as in Example 27, except that the type and the content of the surface treatment agent for the surface-treated copper particles, the content of the silver particles, the type and the content of the glass particles, the content of the butyl carbitol acetate (BCA) solution including 4% of ethyl cellulose (EC), and the type and the content of the phosphorous-containing compound, which was contained, if necessary, were changed as shown in Table 5, paste compositions 28 to 41 for electrodes were prepared.

Then, in the same manner as in Example 27, except that the temperature for heating treatment and the treatment time were changed as shown in Table 5, using the paste compositions 28 to 41 for an electrode obtained, cells 28 to 41 of photovoltaic cells, each having a desired electrode formed therein, were prepared, respectively.

Comparative Example 7

In the same manner as in Example 27, except that the surface-treated copper particles were not used in the preparation of the paste composition for an electrode and the respective components were changed to the compositions shown in Table 5 in Example 27, a paste composition C7 for an electrode was prepared.

In the same manner as in Example 27, except that the paste composition C7 for an electrode not including the surface-treated copper particles was used, a cell C7 of a photovoltaic cell was prepared.

Comparative Example 8

In the same manner as in Comparative Example 7, except that the temperature of heating treatment (sintering) at a time of forming an electrode was changed from 850° C. to 750° C. in Comparative Example 7, a cell C8 of a photovoltaic cell was prepared.

Comparative Example 9

In the same manner as in Example 27, except that the surface treatment amount of the surface-treated copper particles was changed to 0.0001%, at which the peak temperature of the exothermic peak showing a maximum area was 230° C. in the simultaneous ThermoGravimetry/Differential Thermal Analysis in Example 27, a paste composition C9 for an electrode was prepared.

In the same manner as in Example 27, except that the paste composition C9 for an electrode was used, a cell C9 of a photovoltaic cell was prepared.

TABLE 5

| | Surface-treated copper particles | | | | Silver particles | | | | 4% EC-containing BCA solution (parts) | Phosphorous-containing compound | | Treatment temperature/ Treatment time |
|---|---|---|---|---|---|---|---|---|---|---|---|---|
| Example | Content (parts) | Type | Particle diameter (D 50%) (μm) | TG-DTA peak temperature (° C.) | Content (parts) | Particle diameter (D 50%) (μm) | Glass particles Content (parts) | Type | | Content (parts) | Type | |
| Example 27 | 39.2 | BTA | 1.5 | 290 | 45.9 | 3 | 1.7 | G19 | 13.2 | 0 | — | 850° C./ 2 seconds |
| Example 28 | 39.2 | BTA | 1.5 | 290 | 45.9 | 3 | 1.7 | G19 | 13.2 | 0 | — | 750° C./ 10 seconds |
| Example 29 | 39.2 | BTA | 1.5 | 290 | 45.9 | 1 | 1.7 | G19 | 13.2 | 0 | — | 850° C./ 2 seconds |
| Example 30 | 39.2 | BTA | 1.5 | 290 | 45.9 | 3 | 1.7 | G19 | 10.2 | 3 | Phosphoric ester | 850° C./ 2 seconds |

TABLE 5-continued

| | Surface-treated copper particles | | | | Silver particles | | Glass particles | | 4% EC-containing BCA solution (parts) | Phosphorous-containing compound | | Treatment temperature/ Treatment time |
|---|---|---|---|---|---|---|---|---|---|---|---|---|
| Example | Content (parts) | Type | Particle diameter (D 50%) (μm) | TG-DTA peak temperature (° C.) | Content (parts) | Particle diameter (D 50%) (μm) | Content (parts) | Type | | Content (parts) | Type | |
| Example 31 | 39.2 | BTA | 1.1 | 290 | 45.9 | 3 | 1.7 | G19 | 13.2 | 0 | — | 850° C./ 2 seconds |
| Example 32 | 39.2 | BTA | 1.1 | 290 | 45.9 | 3 | 1.7 | AY1 | 13.2 | 0 | — | 850° C./ 2 seconds |
| Example 33 | 39.2 | Stearic acid | 1.5 | 280 | 45.9 | 3 | 1.7 | G19 | 13.2 | 0 | — | 850° C./ 2 seconds |
| Example 34 | 39.2 | Stearic acid | 1.5 | 280 | 45.9 | 3 | 1.7 | G19 | 13.2 | 0 | — | 750° C./ 10 seconds |
| Example 35 | 39.2 | Stearic acid | 1.5 | 280 | 45.9 | 3 | 1.7 | AY1 | 13.2 | 0 | — | 750° C./ 10 seconds |
| Example 36 | 39.2 | Linoleic acid | 1.5 | 285 | 45.9 | 3 | 1.7 | AY1 | 13.2 | 0 | — | 750° C./ 10 seconds |
| Example 37 | 54.8 | Stearic acid | 1.5 | 280 | 30.3 | 3 | 1.7 | AY1 | 13.2 | 0 | — | 700° C./ 20 seconds |
| Example 38 | 54.8 | Stearic acid | 1.5 | 280 | 30.3 | 3 | 1.7 | AY1 | 10.2 | 3 | Cyclic phosphazene | 700° C./ 20 seconds |
| Example 39 | 75.1 | Linoleic acid | 1.1 | 285 | 10 | 3 | 1.7 | AY1 | 13.2 | 0 | — | 700° C./ 20 seconds |
| Example 40 | 38.4 | BTA | 1.5 | 290 | 45 | 3 | 3.4 | G19 | 13.2 | 0 | — | 850° C./ 2 seconds |
| Example 41 | 35 | BTA | 1.5 | 290 | 41.6 | 3 | 3.4 | G19 | 20 | 0 | — | 850° C./ 2 seconds |
| Comparative Example 7 | — | — | — | — | 85.1 | 3 | 1.7 | G19 | 13.2 | 0 | — | 850° C./ 2 seconds |
| Comparative Example 8 | — | — | — | — | 85.1 | 3 | 1.7 | G19 | 13.2 | 0 | — | 750° C./ 10 seconds |
| Comparative Example 9 | 48.2 | BTA | 1.5 | 230 | 2 | 3 | 1.7 | G19 | 13.2 | 0 | — | 850° C./ 2 seconds |

<Evaluation>

The photovoltaic cells prepared were evaluated with a combination of WXS-155 S-10 manufactured by Wacom-Electric Co., Ltd. as artificial sunlight and a measurement device of I-V CURVE TRACER MP-160 (manufactured by EKO INSTRUMENT CO., LTD.) as a current-voltage (I-V) evaluation and measurement device. Eff (conversion efficiency), FF (fill factor), Voc (open voltage), and Jsc (short circuit current) indicating the power generation performances as a photovoltaic cell were obtained by carrying out the measurement in accordance with each of JIS-C-8912, JIS-C-8913, and JIS-C-8914. The respective measured values are shown in Table 6 in terms of a relative value when the value measured in Comparative Example 7 was taken as 100.0.

Furthermore, in Comparative Example 9, the resistivity of the electrode by oxidation of the copper-containing particles increased, and thus, could not be evaluated.

TABLE 6

| | | Power generation performance as solar cell | | | |
|---|---|---|---|---|---|
| Example | Treatment temperature/ Treatment time | Eff (relative value) Conversion efficiency | FF (relative value) Fill factor | Voc (relative value) Open voltage | Jsc (relative value) Short circuit current |
| Example 27 | 850° C./2 seconds | 101 | 102 | 98.3 | 102.2 |
| Example 28 | 750° C./10 seconds | 85.4 | 93.2 | 92.2 | 94.2 |
| Example 29 | 850° C./2 seconds | 98.2 | 96.2 | 98 | 100 |
| Example 30 | 850° C./2 seconds | 100 | 101 | 98.5 | 103 |
| Example 31 | 850° C./2 seconds | 103 | 104 | 99.3 | 104.2 |
| Example 32 | 850° C./2 seconds | 102 | 103.5 | 99 | 103.4 |
| Example 33 | 850° C./2 seconds | 104 | 109 | 98.3 | 109.2 |
| Example 34 | 750° C./10 seconds | 90.1 | 95.3 | 97.1 | 97 |
| Example 35 | 750° C./10 seconds | 92.1 | 95.9 | 97.1 | 99.2 |
| Example 36 | 750° C./10 seconds | 100.2 | 101 | 98.3 | 100.9 |
| Example 37 | 700° C./20 seconds | 100.9 | 102.1 | 98.9 | 101.1 |
| Example 38 | 700° C./20 seconds | 100.1 | 99.1 | 98.1 | 100 |
| Example 39 | 700° C./20 seconds | 100.1 | 99.1 | 98.1 | 100 |
| Example 40 | 850° C./2 seconds | 101 | 102 | 98.3 | 102.2 |
| Example 41 | 850° C./2 seconds | 102 | 104 | 99.7 | 105 |

TABLE 6-continued

| | | Power generation performance as solar cell | | | |
|---|---|---|---|---|---|
| Example | Treatment temperature/ Treatment time | Eff (relative value) Conversion efficiency | FF (relative value) Fill factor | Voc (relative value) Open voltage | Jsc (relative value) Short circuit current |
| Comparative Example 7 | 850° C./2 seconds | 100 | 100 | 100 | 100 |
| Comparative Example 8 | 750° C./10 seconds | 65.6 | 82.4 | 82.4 | 82.4 |
| Comparative Example 9 | 850° C./2 seconds | — | — | — | — |

Example 42

By using the paste composition 27 for an electrode obtained above, a cell 42 of a photovoltaic cell having the structure as shown in FIG. 4A was prepared. Further, the heating treatment was carried out at 750° C. for 10 seconds.

The cell of a photovoltaic cell obtained was evaluated in the above-described manner, and found to exhibit excellent characteristics as above.

From the above description, it can be seen that an electrode having a low resistivity can be formed even with the use of copper as a conductive metal of an electrode, by using the paste composition for an electrode according to the present invention, and a photovoltaic cell exhibiting excellent characteristics can be constituted. In addition, it can also be seen that even at a treatment temperature (sintering temperature) of 750° C. and 850° C., the performances equivalent to or higher than conventional electrode paste compositions using silver are exhibited.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A paste composition for an electrode, the paste composition comprising:
    copper-containing particles having a peak temperature of an exothermic peak showing a maximum area in a simultaneous ThermoGravimetry/Differential Thermal Analysis of 280° C. or higher;
    glass particles;
    a solvent; and
    a resin,
    wherein the copper-containing particles are phosphorus-containing copper alloy particles and the content of phosphorus in the phosphorus-containing copper alloy particles is from 1% by mass to 8% by mass.

2. The paste composition for an electrode according to claim 1, wherein the glass particles have a glass softening point of 600° C. or lower and a crystallization starting temperature of higher than 600° C.

3. The paste composition for an electrode according to claim 1, wherein the glass particles comprise diphosphorus pentoxide-divanadium pentoxide-based glass.

4. The paste composition for an electrode according to claim 1, further comprising silver particles.

5. The paste composition for an electrode according to claim 4, wherein a content of the copper-containing particles is from 9% by mass to 88% by mass when a total amount of the copper-containing particles and the silver particles is taken as 100% by mass.

6. The paste composition for an electrode according to claim 5, wherein:
    a total content of the copper-containing particles and the silver particles is from 70% by mass to 94% by mass;
    a content of the glass particles is from 0.1% by mass to 10% by mass; and
    a total content of the solvent and the resin is from 3% by mass to 29.9% by mass.

7. The paste composition for an electrode according to claim 4, wherein:
    a total content of the copper-containing particles and the silver particles is from 70% by mass to 94% by mass;
    a content of the glass particles is from 0.1% by mass to 10% by mass; and
    a total content of the solvent and the resin is from 3% by mass to 29.9% by mass.

8. The paste composition for an electrode according to claim 1, further comprising a phosphorus-containing compound.

9. The paste composition for an electrode according to claim 8, wherein the phosphorous-containing compound is at least one selected from the group consisting of phosphoric acid, ammonium phosphate, phosphoric ester and cyclic phosphazene.

10. A photovoltaic cell having an electrode formed by sintering the paste composition for an electrode according to claim 1 which is provided to a silicon substrate.

11. The paste composition of claim 1, wherein the copper alloy particles consist of copper and phosphorus.

12. A paste composition for an electrode, the paste composition comprising:
    phosphorus-containing copper alloy particles;
    glass particles;
    a solvent; and
    a resin,
    wherein the content of phosphorus in the phosphorus-containing copper alloy particles is from 1% by mass to 8% by mass.

13. The paste composition of claim 12, wherein the copper alloy particles consist of copper and phosphorus.

14. The paste composition for an electrode according to claim 12, further comprising silver particles.

15. The paste composition for an electrode according to claim 14, wherein a content of the copper-containing particles is from 9% by mass to 88% by mass when a total amount of the copper-containing particles and the silver particles is taken as 100% by mass.

16. The paste composition for an electrode according to claim 15, wherein:
   a total content of the copper-containing particles and the silver particles is from 70% by mass to 94% by mass;
   a content of the glass particles is from 0.1% by mass to 10% by mass; and
   a total content of the solvent and the resin is from 3% by mass to 29.9% by mass.

17. The paste composition for an electrode according to claim 14, wherein:
   a total content of the copper-containing particles and the silver particles is from 70% by mass to 94% by mass;
   a content of the glass particles is from 0.1% by mass to 10% by mass; and
   a total content of the solvent and the resin is from 3% by mass to 29.9% by mass.

\* \* \* \* \*